(12) United States Patent
Kang

(10) Patent No.: US 7,378,893 B1
(45) Date of Patent: *May 27, 2008

(54) CIRCUIT AND METHOD FOR DIGITAL DELAY AND CIRCUITS INCORPORATING THE SAME

(75) Inventor: Dae Woon Kang, Lafayette, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/644,476

(22) Filed: Dec. 22, 2006

Related U.S. Application Data

(63) Continuation-in-part of application No. 11/267,415, filed on Nov. 4, 2005, now Pat. No. 7,224,199.

(51) Int. Cl.
*G06F 1/04* (2006.01)

(52) U.S. Cl. .............. 327/291; 327/298; 327/299; 327/175

(58) Field of Classification Search .............. None
See application file for complete search history.

(56) References Cited

U.S. PATENT DOCUMENTS

| 6,094,082 | A | 7/2000 | Gaudet |
| 6,100,735 | A | 8/2000 | Lu |
| 6,121,808 | A | 9/2000 | Gaudet |
| 6,194,928 | B1 | 2/2001 | Heyne |
| 6,798,258 | B2 | 9/2004 | Rieven |
| 7,224,199 | B1 * | 5/2007 | Kang .................. 327/291 |

OTHER PUBLICATIONS

Hsiang-Hui Chang et al., "A Wide-Range and Fast-Locking All-Digital Cycle-Controlled Delay-Locked Loop," IEEE Journal of Solid-State Circuits, vol. 40, No. 3, Mar. 2005, pp. 661-670.

Jong-Tae Kwak et al., "A Low Cost High Performance Register-Controlled Digital DLL for 1Gbps x32 DDR SDRAM," 2003 Symposium on VLSI Circuits Digest of Technical Papers, pp. 283-284.

Kazuyuki Nakamura et al, "A CMOS 50% Duty Cycle Repeater Using Complementary Phase Blending," IEEE, 2000 Symposium on VLSI Circuits Digest of Technical Papers, pp. 48-49.

Tatsuya Matano et al., "A 1-Gb/s/pin 512-Mb DDRII SDRAM Using a Digital DLL and a Slew-Rate-Controlled Output Buffer," IEEE Journal of Solid-State Circuits, vol. 38, No. 5, May 2003, pp. 762-768.

Jang-Jin Nam et al., "An All-Digital CMOS Duty Cycle Correction Circuit with a Duty-Cycle Correction Range of 15%-to-85% for Multi-Phase Applications," IEICE Trans. Electron, vol. E88-C, No. 4, Apr. 2005, pp. 773-777.

* cited by examiner

*Primary Examiner*—N. Drew Richards
*Assistant Examiner*—An T. Luu

(57) ABSTRACT

A method includes generating multiple delayed versions of a first signal using at least one first delay line, selecting at least one version of the first signal, and generating a second signal based on the at least one selected version of the first signal. The method also includes generating multiple delayed versions of the second signal using at least one second delay line, and selecting at least one version of the second signal. In addition, the method includes modifying selection of the at least one version of the first signal and the at least one version of the second signal to achieve a desired output signal. This method could be used in various circuits, such as duty cycle correction circuits, frequency multiplier circuits, and digital multiphase oscillator circuits.

21 Claims, 13 Drawing Sheets

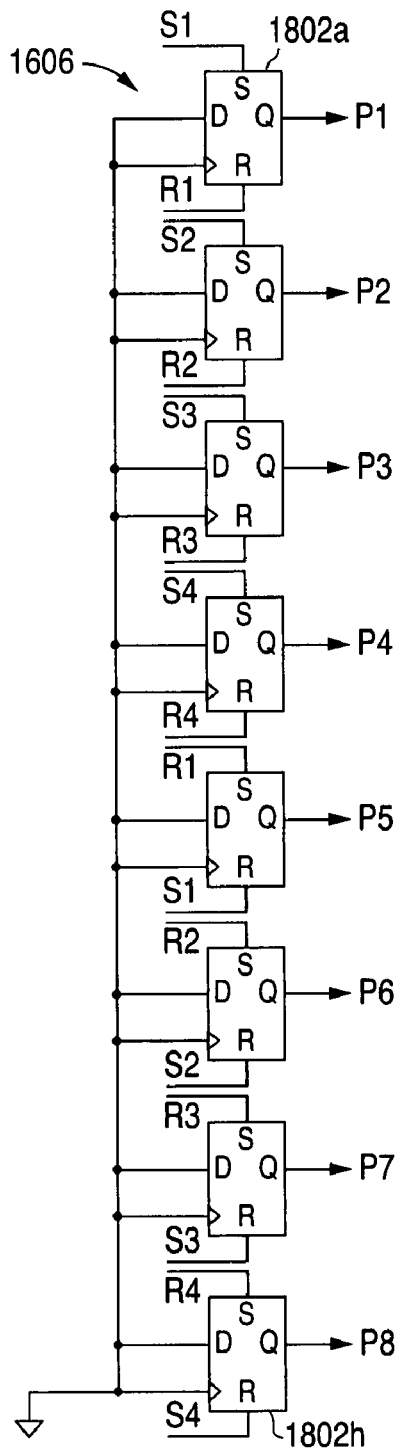
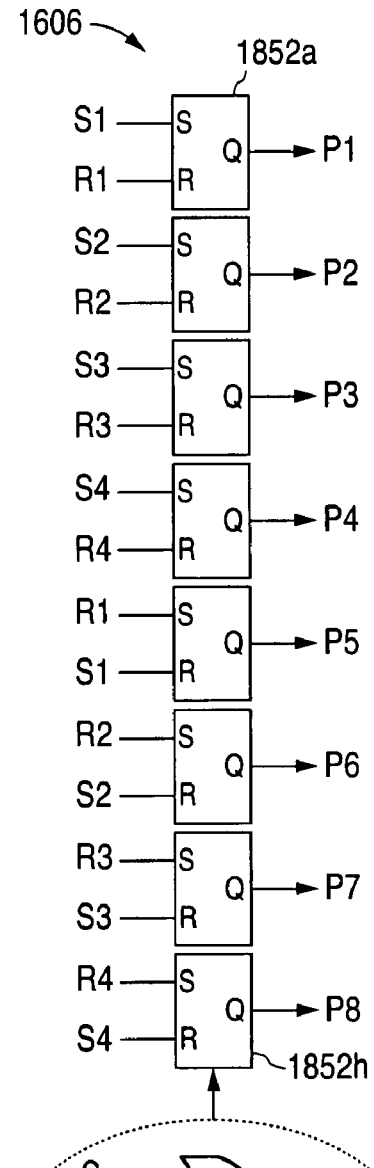
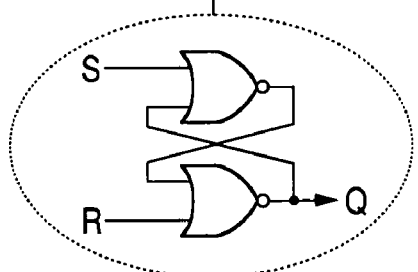
FIG. 18A  FIG. 18B

CIRCUIT AND METHOD FOR DIGITAL DELAY AND CIRCUITS INCORPORATING THE SAME

CROSS-REFERENCE TO RELATED APPLICATIONS

This application claims priority under 35 U.S.C. § 120 as a continuation-in-part of U.S. patent application Ser. No. 11/267,415 filed on Nov. 4, 2005, now U.S. Pat. No. 7,224,199 which is hereby incorporated by reference.

TECHNICAL FIELD

This disclosure is generally directed to digital circuits and more specifically to a circuit and method for digital delay and circuits incorporating the same.

BACKGROUND

Many types of circuits often need to delay digital signals in order to operate properly. For example, duty cycle correction circuits often delay one or more digital signals in order to produce a clock signal having a duty cycle of approximately fifty percent. This may be useful in various applications, such as in synchronous dynamic random access memories (SDRAMs) and delay locked loops (DLLs), where both rising and falling edges of a clock signal are used.

Conventional circuits that delay digital signals often suffer from various problems. For example, the accuracy of conventional duty cycle correction circuits is often proportional to the "lock time" needed to reach the appropriate duty cycle. Higher accuracy typically requires longer lock times, and shorter lock times typically require lower accuracy. Also, conventional circuits that delay digital signals often suffer from process, voltage, and temperature (PVT) variations. Because of this, the behaviour of the conventional circuits typically varies based on changes or variations in manufacturing processes, operating voltages, and operating temperatures.

BRIEF DESCRIPTION OF THE DRAWINGS

For a more complete understanding of this disclosure and its features, reference is now made to the following description, taken in conjunction with the accompanying drawings, in which:

FIGS. 16 through 18B illustrate an example digital multiphase oscillator according to one embodiment of this disclosure.

DETAILED DESCRIPTION

FIGS. 1 through 19, discussed below, and the various embodiments described in this patent document are by way of illustration only and should not be construed in any way to limit the scope of this disclosure. Those skilled in the art will understand that the principles described in this disclosure may be implemented in any suitably arranged device or system.

In general, FIGS. 1 through 19 illustrate various circuits and methods that delay digital signals. The circuits and methods operate by dynamically adjusting an amount of time that one or more digital signals are delayed. This functionality is useful in a wide variety of applications. For example, as shown in the following figures, digital delay may be used in duty cycle correction circuits to accurately produce clock signals having a duty cycle of approximately fifty percent. Digital delay may also be used in clock frequency multiplier circuits to accurately multiply the frequency of clock signals. In addition, digital delay may be used in digital multiphase oscillator circuits to produce multiple clock signals having accurate phase differences.

Figure 1:
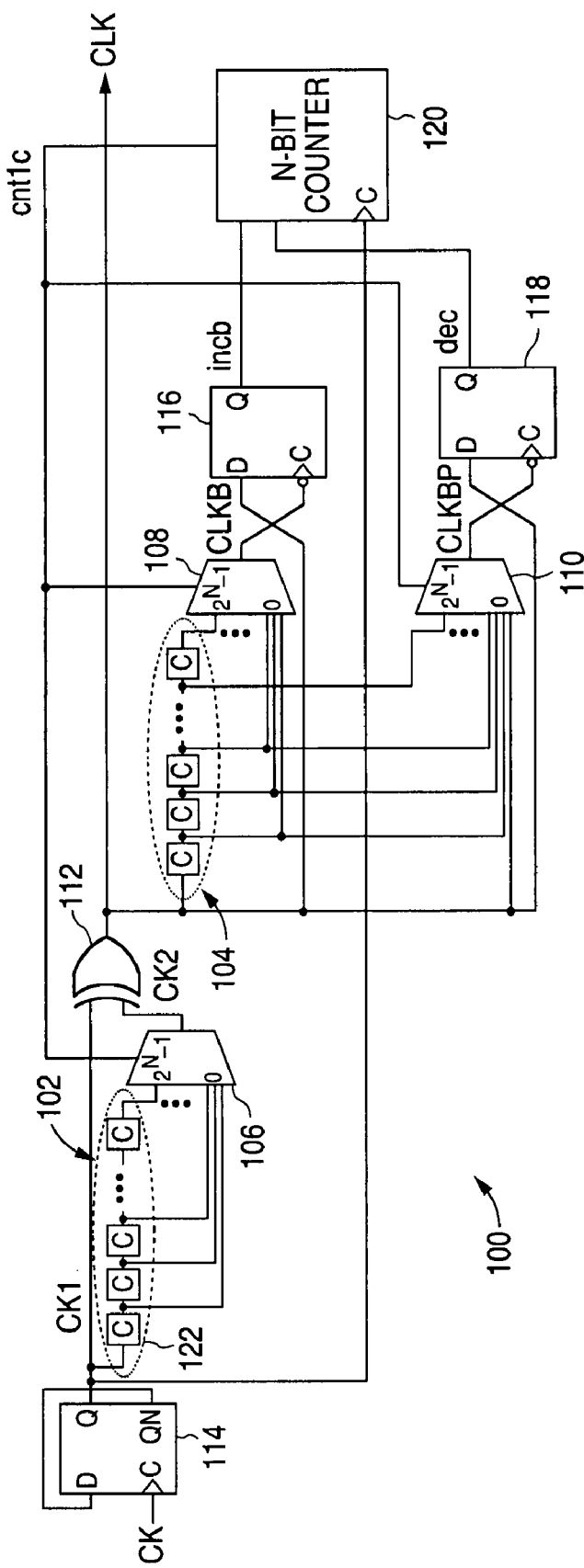
FIGS. 1 through 3 illustrate a first example duty cycle correction circuit according to one embodiment of this disclosure.
Figure 2:
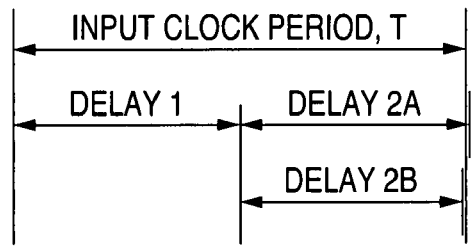
Figure 3:
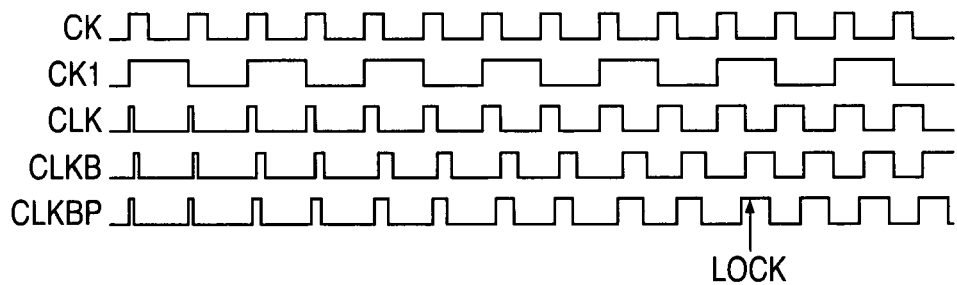

FIGS. 1 through 3 illustrate a first example duty cycle correction circuit according to one embodiment of this disclosure. In particular, FIG. 1 illustrates a duty cycle correction circuit 100, and FIGS. 2 and 3 illustrate example operations of the duty cycle correction circuit 100.

As shown in FIG. 1, the duty cycle correction circuit 100 includes two delay lines 102-104, three multiplexors 106-110, an XOR gate 112, three registers 114-118, and an N-bit up-down counter 120.

Each of the delay lines 102-104 receives an input signal and produces multiple delayed versions of the input signal. For example, the delay line 102 receives a clock signal CK1 and produces multiple delayed versions of the clock signal CK1, which are delayed by different amounts and provided at different tap points in the delay line 102. The delay line 104 receives a clock signal CLK and produces multiple delayed versions of the clock signal CLK, which are delayed by different amounts and provided at different tap points in the delay line 104. Each of the delay lines 102-104 represents any suitable structure for producing multiple delayed versions of an input signal. In this example, each of the delay lines 102-104 is formed from multiple delay cells 122, and a tap point exists after each delay cell 122. Each delay cell 122 could represent one or more buffers, inverters, or other structures capable of delaying a signal. In some embodiments, the delay lines 102-104 represent coarse delay lines, where each delay cell 122 provides a relatively larger amount of delay (such as when each delay cell 122 is formed from sixteen buffers or inverters). In particular embodiments, the delay lines 102-104 are identical to one another. "Tap points" generally represent points in a delay line where signals delayed by different amounts are provided.

Each of the multiplexors 106-110 receives multiple input signals and a control signal and selects one of the input signals for output based on the control signal. For example, the multiplexor 106 may receive $2^N$ input signals from tap points in the delay line 102 and select one signal for output based on an N-bit control signal. The multiplexor 108 may receive $2^N$ signals from tap points in the delay line 104 and select one signal for output based on an N-bit control signal. The multiplexor 110 may receive $2^N$ signals (the clock signal CLK and $2^N-1$ delayed versions of the clock signal CLK from tap points in the delay line 104) and select one signal for output based on an N-bit control signal. The value N may represent the number of bits in a signal produced by the N-bit up-down counter 120. Each of the multiplexors 106-110 represents any suitable structure for receiving multiple signals and outputting a selected one of the signals.

The XOR gate 112 receives two input signals and performs logical XOR operations. In this example, the XOR gate 112 receives the clock signal CK1 output by the register 114 and a clock signal CK2 output by the multiplexor 106. The XOR gate 112 produces the clock signal CLK, which is output by the duty cycle correction circuit 100. The XOR gate 112 represents any suitable structure capable of performing logical XOR operations.

Each of the registers 114-118 samples an input signal and outputs the sampled value. For example, the register 116 receives and samples the signal CLK and is clocked by a signal CLKB from the multiplexor 108, thereby producing a signal incb. The register 118 receives and samples the signal CLK and is clocked by a signal CLKBP from the multiplexor 110, thereby producing a signal dec. The register 114 receives and samples its own inverted output signal and is clocked by the input clock signal CK, thereby producing the clock signal CK1. Each of the registers 114-118 represents any suitable structure for sampling an input signal. The registers 114-118 could, for example, represent D flip-flops.

The N-bit up-down counter 120 represents a counter capable of incrementing and decrementing an N-bit counter value, where the counter value is output as an N-bit control signal cnt1c. For example, the counter 120 may use the signals incb and dec from the registers 116-118 to determine whether to increment the counter value, decrement the counter value, or leave the counter value unchanged. As a particular example, the counter 120 could implement the following logic:

if (incb & ~dec) then cnt1c=cnt1c
    else if (~incb) then cnt1c=cnt1c+1
    else if (dec) then cnt1c=cnt1c-1
    else cnt1c=cnt1c where "&" represents a logical AND operation and "~" represents a logical NOT operation. The counter 120 represents any suitable structure capable of incrementing and decrementing a counter value.

In one aspect of operation, the duty cycle correction circuit 100 adjusts the output of the multiplexors 106-110 so that the output clock signal CLK achieves a duty cycle of approximately fifty percent. Various components shown in FIG. 1 are used as a locking mechanism to achieve a duty cycle of approximately fifty percent in the output clock signal CLK. The locking mechanism could, for example, include the registers 116-118 and the counter 120. Among other things, the locking mechanism generates the control signal cnt1c, and the control signal cnt1c controls which signals are output by the multiplexors 106-110. By adjusting the operation of the multiplexors 106-110, the locking mechanism controls the amount of delay provided by the delay lines 102-104. Selecting an appropriate delay allows the duty cycle correction circuit 100 to generate an output clock signal CLK having a duty cycle of approximately fifty percent.

Example operations of the duty cycle correction circuit 100 are shown in FIGS. 2 and 3. In FIG. 2, "Delay 1" corresponds to the delay provided by the delay line 102 at the tap point selected by the multiplexor 106, "Delay 2A" corresponds to the delay provided by the delay line 104 at the tap point selected by the multiplexor 108, and "Delay 2B" corresponds to the delay provided by the delay line 104 at the tap point selected by the multiplexor 110. In this example, Delay 1 and Delay 2A are approximately equal, and Delay 2B is shorter than Delay 1 and Delay 2A by an amount equal to the delay associated with one delay cell 122.

As shown in FIG. 2, the duty cycle correction circuit 100 generally operates to divide a period T of the input clock signal CK in half. The period T of the input clock signal CK could, for example, represent the time period between two rising edges in the input clock signal CK. The counter 120 increments or decrements the counter value forming the control signal cnt1c until the end of period T occurs within a range defined by (i) the combined value of Delay 1 and Delay 2A and (ii) the combined value of Delay 1 and Delay 2B. As a particular example, the counter value may be adjusted until a rising edge in the clock signal CLK occurs between rising edges in the clock signals CLKB and CLKBP. At this point, the counter value of the counter 120 is associated with particular tap points in the delay lines 102-104, and the particular tap points can be used to generate a clock signal CLK having a duty cycle of approximately fifty percent.

As shown in FIG. 3, the input clock signal CK received by the duty cycle correction circuit 100 may represent an asymmetric clock signal. The register 114 effectively divides the frequency of the clock signal CK by two and produces the clock signal CK1, which has a duty cycle of approximately fifty percent. The delay line 102 and the multiplexor 106 provide a delayed version of the clock signal CK1 as clock signal CK2 to the XOR gate 112. The XOR gate 112 produces the clock signal CLK using clock signals CK1 and CK2. As shown in FIG. 3, the duty cycle of the clock signal CLK may generally increase due to the counter 120 varying its counter value. Eventually, the clock signal CLK reaches a duty cycle of approximately fifty percent.

The fifty percent duty cycle is achieved by the counter 120 varying its counter value to satisfy the condition shown in FIG. 2. The multiplexor 108 provides a delayed version of the clock signal CLK as clock signal CLKB to the register 116, and the multiplexor 110 provides a delayed version of the clock signal CLK as clock signal CLKBP to the register 118. As shown in FIG. 3, the clock signal CLKBP leads the clock signal CLKB (by one delay cell delay). The CLKB and CLKBP signals are used by the registers 116-118 to produce the incb and dec signals, which are used by the counter 120 to increment or decrement its counter value.

In this example, the pulses in the clock signals CLK, CLKB, and CLKBP shown in FIG. 3 generally widen as the counter 120 adjusts its counter value. At a lock time, a rising edge in the clock signal CLK occurs at or between a rising edge in the clock signal CLKB and a rising edge in the clock signal CLKBP. This condition could be indicated, for example, by the signal incb having a high value and the signal dec having a low value. At this point, the clock signal CLK has a duty cycle of approximately fifty percent, even though the clock signal CK is asymmetric and even though the delay lines 102-104 may suffer from process, voltage, and temperature (PVT) variations. In some embodiments, the multiplexors 106-110 initially output the signals received at their "0" inputs, and the multiplexors 106-110 output different signals as the value provided by the counter 120 changes.

Figure 5:
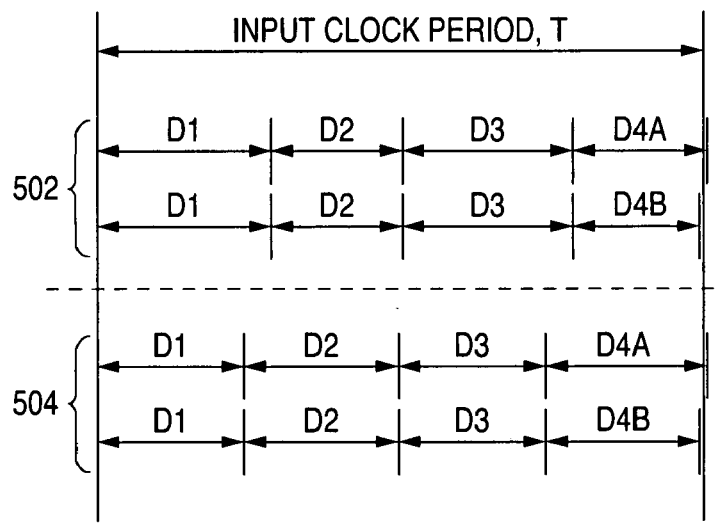
FIGS. 4 and 5 illustrate a second example duty cycle correction circuit according to one embodiment of this disclosure.
Figure 4:
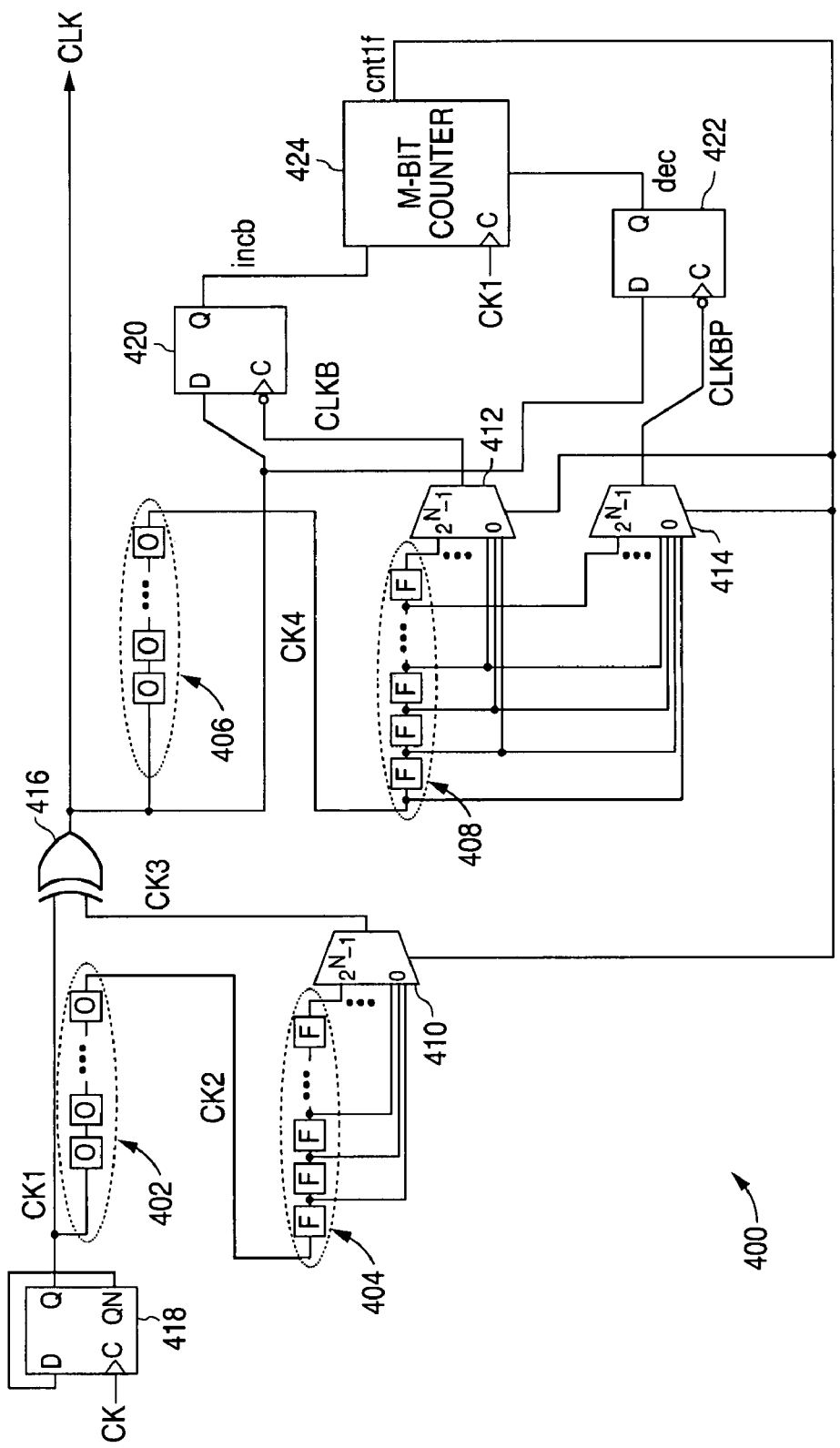

FIGS. 4 and 5 illustrate a second example duty cycle correction circuit according to one embodiment of this disclosure. In particular, FIG. 4 illustrates a duty cycle correction circuit 400, and FIG. 5 illustrates example operations of the duty cycle correction circuit 400.

As shown in FIG. 4, the duty cycle correction circuit 400 includes four delay lines 402-408, three multiplexors 410-414, an XOR gate 416, three registers 418-422, and an M-bit up-down counter 424. In this example embodiment, the delay lines 402 and 406 represent offset delay lines, and the delay lines 404 and 408 represent fine delay lines. The offset delay lines 402 and 406 represent delay lines each capable of providing a known and relatively fixed amount of delay, although the amount of delay may be subject to PVT or other variations. The fine delay lines 404 and 408 represent delay lines formed from delay cells capable of providing a relatively smaller amount of delay (such as when each delay cell is formed from one or several buffers or inverters). In some embodiments, the delay lines 402 and 406 are identical to one another, and the delay lines 404 and 408 are identical to one another.

The duty cycle correction circuit 100 of FIG. 1 uses coarse tuning (delay cells with larger delay increments) to identify the appropriate tap points for the delay lines 102-104. The duty cycle correction circuit 400 of FIG. 4 uses a combination of (i) relatively fixed delays provided by the offset delay lines 402 and 406 and (ii) fine tuning (delay cells with smaller delay increments in the delay lines 404 and 408) to identify the appropriate tap points for the delay lines 402-408. This may be useful, for example, when the offset delay lines 402 and 406 can provide delays that are generally close to the delays needed to produce a clock signal CLK with a duty cycle of approximately fifty percent. The fine delay lines 404 and 408 may then be used to compensate for PVT variations and to provide whatever additional delays are needed to produce a clock signal CLK with a duty cycle of approximately fifty percent. As a particular example, this may be useful when the frequency of an input clock signal CK and PVT variations can be known or estimated ahead of time.

As shown in FIG. 4, the delay lines 402-404 are used to produce the delayed version of the clock signal CK1 provided to the XOR gate 416 (as clock signal CK3). The delay lines 406-408 are used to produce the clock signals CLKB and CLKBP, which clock the registers 420-422 that generate the signals incb and dec. The multiplexors 410-414 are each capable of receiving $2^M$ input signals and an M-bit control signal, where M represents the number of bits used by the counter 424. The counter 424 generates an M-bit control signal cnt1$f$, which controls the operation of the multiplexors 410-414 and allows fine tuning using the delay lines 404 and 408. In some embodiments, the multiplexors 410-414 initially output the signals received at their "0" inputs, and the multiplexors 410-414 output different signals as the value provided by the counter 424 changes. As a particular example, the counter 424 could implement the following logic:

if (incb & ~dec) then cnt1$f$=cnt1$f$
else if (~incb) then cnt1$f$=cnt1$f$+1
else if (dec) then cnt1$f$=cnt1$f$−1
else cnt1$f$=cnt1$f$.

Various components shown in FIG. 4 implement the same type of locking mechanism described above with respect to FIG. 1. The locking mechanism could, for example, include the registers 420-422 and the counter 424. Among other things, the locking mechanism generates the control signal cnt1$f$, which adjusts the operation of the multiplexors 410-414 to achieve a duty cycle of approximately fifty percent in the output clock signal CLK.

The duty cycle correction circuit 400 shown in FIG. 4 may provide a relatively fast lock time while remaining relatively accurate. In this example, the output clock signal CLK may be generated initially with a duty cycle relatively close to fifty percent. This is due to the delays provided by the offset delay lines 402 and 406. The output clock signal CLK then moves relatively quickly to a duty cycle of approximately fifty percent using the fine delay lines 404 and 408.

Example operations of the duty cycle correction circuit 400 are shown in FIG. 5. In FIG. 5, "D1" corresponds to the delay provided by the delay line 402, "D2" corresponds to the delay provided by the delay line 404 at the tap point selected by the multiplexor 410, and "D3" corresponds to the delay provided by the delay line 406. Also, "D4A" corresponds to the delay provided by the delay line 408 at the tap point selected by the multiplexor 412, and "D4B" corresponds to the delay provided by the delay line 408 at the tap point selected by the multiplexor 414. In this example, D1 and D3 are approximately equal, D2 and D4A are approximately equal, and D4B is shorter than D2 and D4A by an amount equal to the delay associated with one delay cell in the delay line 408.

As shown in FIG. 5, the counter 424 increments or decrements the counter value forming the control signal cnt1$f$ until the end of period T occurs within a range defined by (i) the combined value of D1, D2, D3, and D4A and (ii) the combined value of D1, D2, D3, and D4B. In this example, however, the delay provided by the offset delay lines 402 and 406 in the duty cycle correction circuit 400 may vary (such as PVT variations). Delays 502 include longer delays D1 and D3, meaning the offset delay lines 402 and 406 provide longer delays. As a result, the delays D2, D4A, and D4B associated with the fine delay lines 404 and 408 are shorter. Delays 504 include shorter delays D1 and D3, meaning the offset delay lines 402 and 406 provide shorter delays. Because of this, the delays D2, D4A, and D4B associated with the fine delay lines 404 and 408 are longer.

Figure 7:
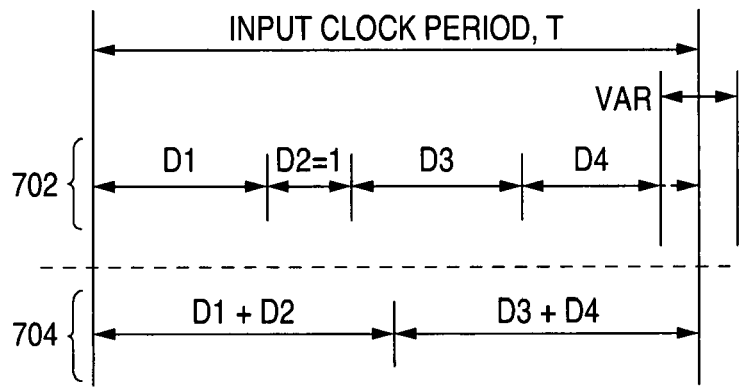
FIGS. 6 and 7 illustrate an alternate embodiment of the second example duty cycle correction circuit according to one embodiment of this disclosure.
Figure 6:
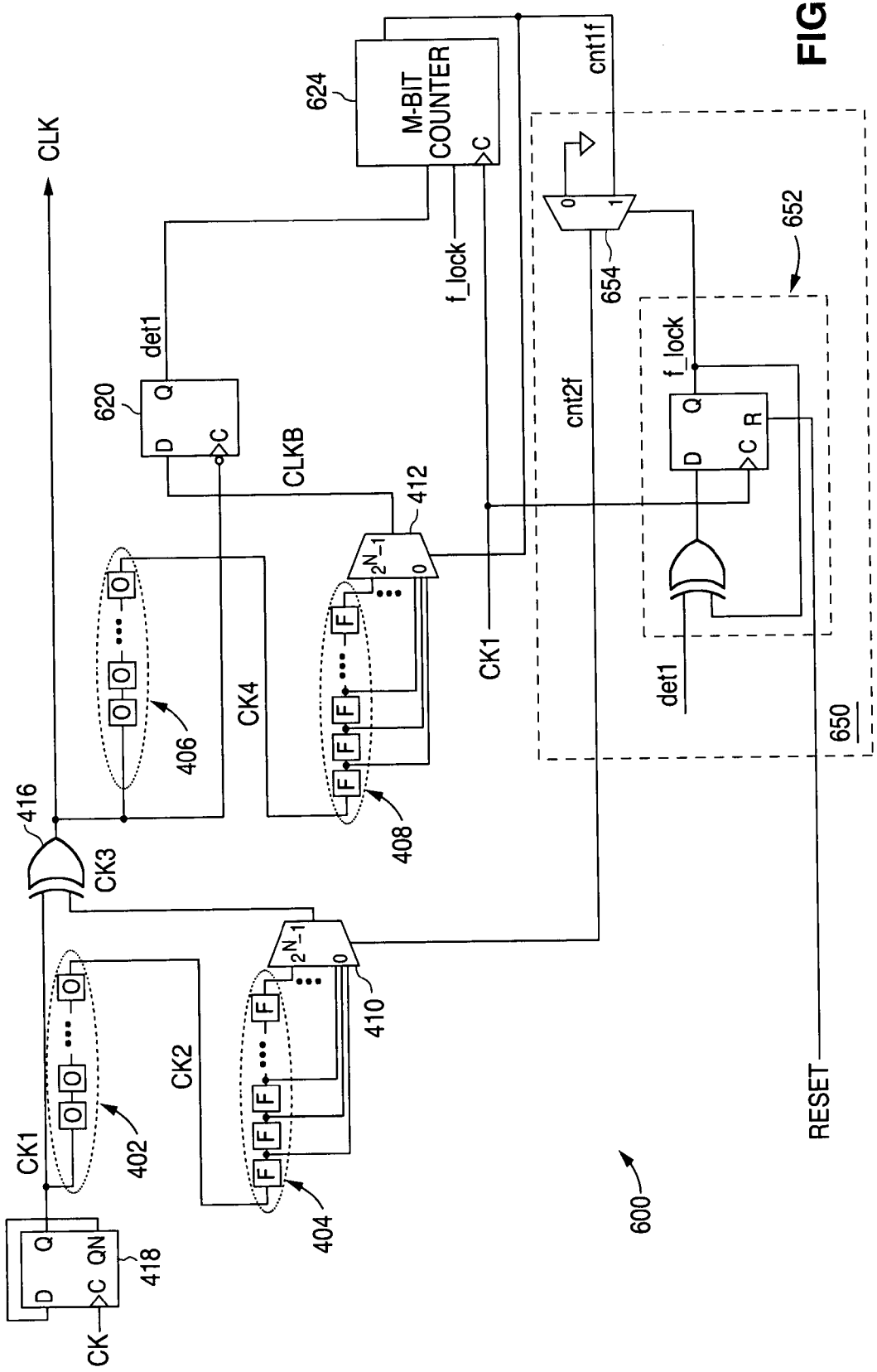

FIGS. 6 and 7 illustrate an alternate embodiment of the second example duty cycle correction circuit according to one embodiment of this disclosure. In particular, FIG. 6 illustrates a duty cycle correction circuit 600, and FIG. 7 illustrates example operations of the duty cycle correction circuit 600.

The duty cycle correction circuit 600 of FIG. 6 is similar to the duty cycle correction circuit 400 of FIG. 4. The duty cycle correction circuit 600 of FIG. 6 is different because it uses a different locking mechanism to achieve an output clock signal CLK having a duty cycle of approximately fifty percent. In this example, the duty cycle correction circuit 600 includes a register 620 in place of the register 420 and a counter 624 in place of the counter 424, and the duty cycle correction circuit 600 omits the multiplexor 414 and the register 422. The register 620 uses falling edges of the clock signal CLK to produce a signal det1. The counter 624 uses the signal det1 to determine whether to vary a counter value provided as the control signal cnt1$f$. As a particular example, the counter 624 could implement the following logic:

if (~f_lock & det1) then cnt1*f*={1'b0, cnt1*f*}
else if (~f_lock & ~det1) then cnt1*f*=cnt1*f*+1
else cnt1*f*=cnt1*f* where "cnt1*f*={1"b0, cnt1*f*}" represents a binary shift right one position operation, "{ }" represents a concatenation operation, and f_lock represents a signal produced by a control signal blocker 650.

The control signal blocker 650 blocks the control signal cnt1*f* from reaching the multiplexor 410. In this example, the control signal blocker 650 includes a finite state machine 652 and a multiplexor 654. The finite state machine 652 uses the signal det1 to produce the signal f_lock, which controls the multiplexor 654. Based on the signal f_lock, the multiplexor 654 outputs either a low logic value or the control signal cnt1*f* as a control signal cnt2*f*, which controls the multiplexor 410. The signal f_lock is also used by the counter 624 as shown above. In this example, the finite state machine 652 includes an OR gate and a register formed from a D flip-flop with reset.

Example operations of the duty cycle correction circuit 600 are shown in FIG. 7. In FIG. 7, "D1"-"D4" correspond to the delays provided by the delay lines 402-408, respectively. In this example, D1 and D3 are approximately equal, and D2 and D4 are approximately equal after locking.

Initially, the signal det1 is low, and the finite state machine 652 outputs a low logic value to the multiplexor 654. This causes the multiplexor 654 to output a low logic value to the multiplexor 410. As a result, the multiplexor 410 outputs the signal received at its "0" input as the signal CK3, where the signal CK3 has been delayed by a single delay cell in the delay line 404 (denoted "D2=1" in FIG. 7). The counter 624 may then adjust the counter value forming the signal cnt1*f*. The signal cnt1*f* is provided to the multiplexor 412, which outputs signals from different tap points in the delay line 408. The signal cnt1*f* is not provided to the multiplexor 410 by virtue of the multiplexor 654.

Eventually, the signal cnt1*f* identifies the amount of delay in the delay line 408 needed to produce an output clock signal CLK having a duty cycle of approximately fifty percent. The various delays D1-D4 at this point are identified as delays 702 in shown in FIG. 7. D4 is shown as being variable since its actual value may depend on various factors, such as PVT variations in the duty cycle correction circuit 600.

When the needed amount of delay in the delay line 408 is identified, the signal det1 goes high. This may occur, for example, when a rising edge in the clock signal CLKB occurs during a falling edge of the clock signal CLK. This causes the counter 624 to divide its current counter value in half (a right shift by one operation). It also causes the finite state machine 654 to output a high signal f_lock to the multiplexor 654, allowing the counter 624 to provide the divided counter value to both of the multiplexors 410-412. The high signal f_lock then causes the counter 624 to maintain the divided counter value as an output. In effect, the counter 624 identifies the needed amount of delay using the delay line 408, and the counter 624 then divides this amount of delay equally between the delay lines 404 and 408. As represented by the delays 704 in FIG. 7, the delay lines 402-404 and the delay lines 406-408 should therefore provide a relatively equal amount of delay.

Figure 8:
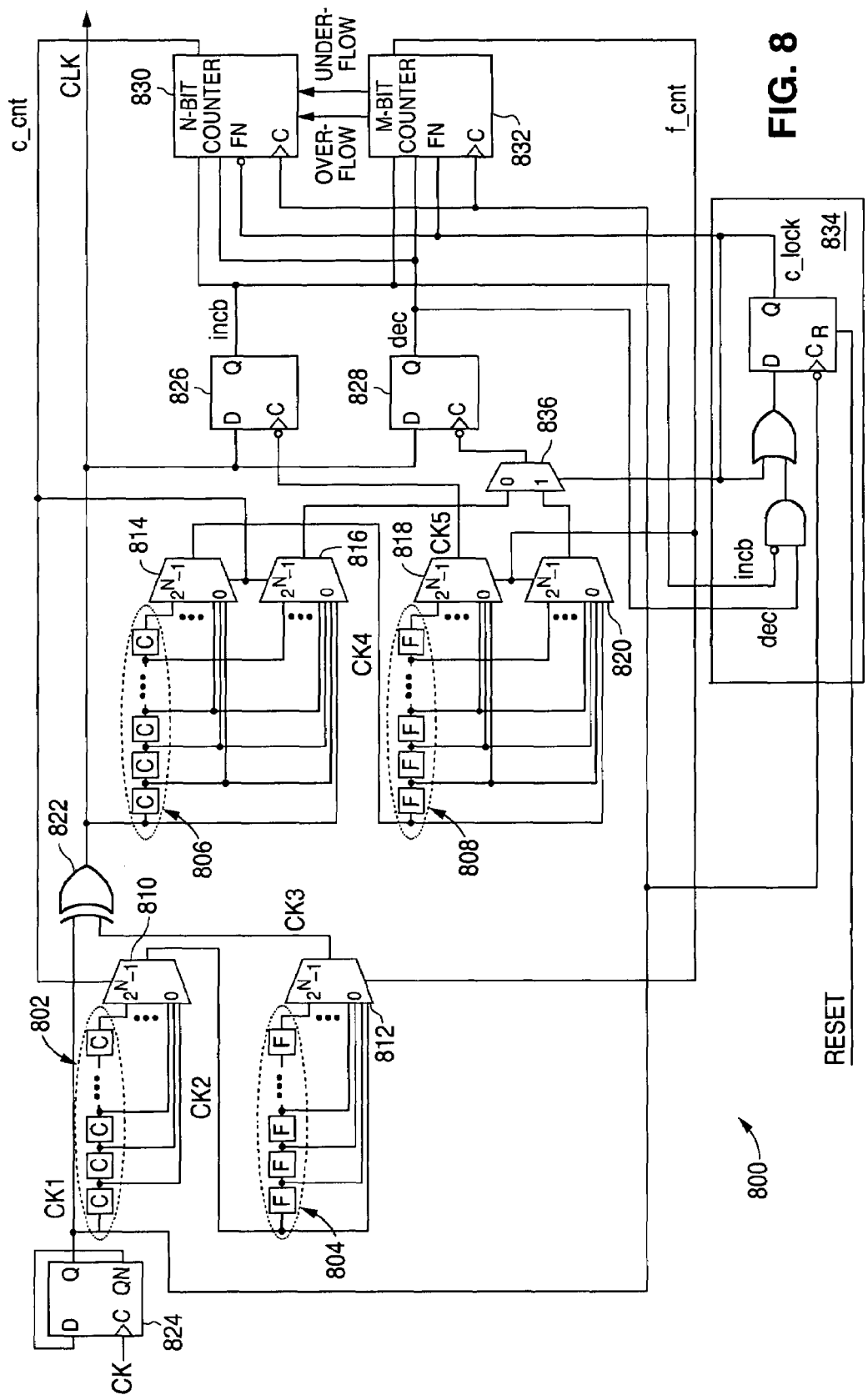
FIG. 8 illustrates a third example duty cycle correction circuit according to one embodiment of this disclosure.

FIG. 8 illustrates a third example duty cycle correction circuit 800 according to one embodiment of this disclosure. As shown in FIG. 8, the duty cycle correction circuit 800 represents a combination of several previous duty cycle correction circuits. In this example, the duty cycle correction circuit 800 includes four delay lines 802-808, six multiplexors 810-820, an XOR gate 822, three registers 824-828, an N-bit up-down counter 830, an M-bit up-down counter 832, and a mutual exclusion lock generator 834. The delay lines 802 and 806 represent coarse delay lines, and the delay lines 804 and 808 represent fine delay lines. In particular embodiments, the delay lines 802 and 806 are identical to one another, and the delay lines 804 and 808 are identical to one another.

The duty cycle correction circuit 800 of FIG. 8 uses both coarse tuning (delay cells with larger delay increments) and fine tuning (delay cells with smaller delay increments) to identify the appropriate tap points for the delay lines 802-808. In some embodiments, coarse tuning is performed using the delay lines 802 and 806, and tap points in the delay lines 802 and 806 are selected. After that, fine tuning is performed using the delay lines 804 and 808, and tap points in the delay lines 804 and 808 are selected. The selected tap points may then be used to generate an output clock signal CLK having a duty cycle of approximately fifty percent. This may be useful, for example, when offset delay lines cannot be used because the fixed amount of delay is not known ahead of time.

As shown in FIG. 8, the delay lines 802-804 are used to produce the delayed version of the clock signal CK1 provided to the XOR gate 822 (as clock signal CK3). The delay lines 806-808 are used to delay the output clock signal CLK produced by the XOR gate 822. The register 826 is clocked by the output of the multiplexor 818, and the register 828 is clocked by the output of the multiplexor 816 or the multiplexor 820 (where the specific clock is selected by a multiplexor 836). The registers 826-828 operate to produce the signals incb and dec, which are provided to the counters 830-832.

The mutual exclusion lock generator 834 generates a lock signal c_lock. The mutual exclusion lock generator 834 helps to ensure that fine tuning (using the delay lines 804 and 808) does not occur during coarse tuning (using the delay lines 802 and 806). In this example, the mutual exclusion lock generator 834 includes an AND gate with one inverted input, an OR gate, and a register formed from a D flip-flop with reset. The mutual exclusion lock generator 834 uses the signals incb and dec to determine when coarse tuning of the duty cycle correction circuit 800 is complete. The signal c_lock prevents fine tuning of the duty cycle correction circuit 800 until coarse tuning is complete. Once coarse tuning is complete, the mutual exclusion lock generator 834 alters the signal c_lock to allow fine tuning of the duty cycle correction circuit 800. As a particular example, when coarse tuning is occurring, the signal c_lock may prevent the counter 832 from changing the value of the control signal cnt1*f*. The multiplexor 836 helps to ensure that the register 828 is clocked by either a signal from the delay line 806 or the delay line 808, depending on whether coarse or fine tuning is occurring.

The counter 830 operates to control the coarse tuning of the duty cycle correction circuit 800 using an N-bit control signal cnt1*c*. The counter 832 operates to control the fine tuning of the duty cycle correction circuit 800 using an M-bit control signal cnt1*f*. As a particular example, the counter 830 could implement the following logic:

if (~c_lock & ~incb & dec) then begin
    cnt1*c*=cnt1*c*
    c_lock=1
end
else if (~c_lock & incb) then begin
    cnt1*c*=cnt1*c*-1
    c_lock=0

```
      end
    else if (~c_lock & ~dec) then begin
      cnt1c=cnt1c+1
      c_lock=0
    end
    else if (c_lock & underflow) then begin
      cnt1c=cnt1c−1
      c_lock=1
    end
    else if (c_lock & overflow) then begin
      cnt1c=cnt1c+1
      c_lock=1
    end
    else begin
      cnt1c=cnt1c
      c_lock=1
    end
``` where underflow and overflow represent values from the counter 832. As another particular example (where M equals four), the counter 832 could implement the following logic:

```
    if (c_lock & ~incb & dec) then begin
      overflow=0
      underflow=0
      cnt1f=cnt1f
    end
    else if (c_lock & incb) then begin
      overflow=0
      if (cnt1f=4'b0000) underflow=1
        else underflow=0
      cnt1f=cnt1f−1
    end
    else if (c_lock & ~dec) then begin
      if (cnt1f=4'b1111) overflow=1
        else overflow=0
      underflow=0
      cnt1f=cnt1f+1
    end
    else begin
      overflow=0
      underflow=0
      cnt1f=cnt1f
    end
```

As with the previous duty cycle correction circuits shown in FIGS. 1 and 4, various components shown in FIG. 8 are used as a locking mechanism, such as the registers 826-828 and the counters 830-832. Among other things, the locking mechanism generates the control signals cnt1c and cnt1f, which identify the signals to be output by the multiplexors 810-820. By adjusting the operation of the multiplexors 810-820, the locking mechanism controls the amount of delay provided by the delay lines 802-808 so that the output clock signal CLK achieves a duty cycle of approximately fifty percent.

Figure 9:
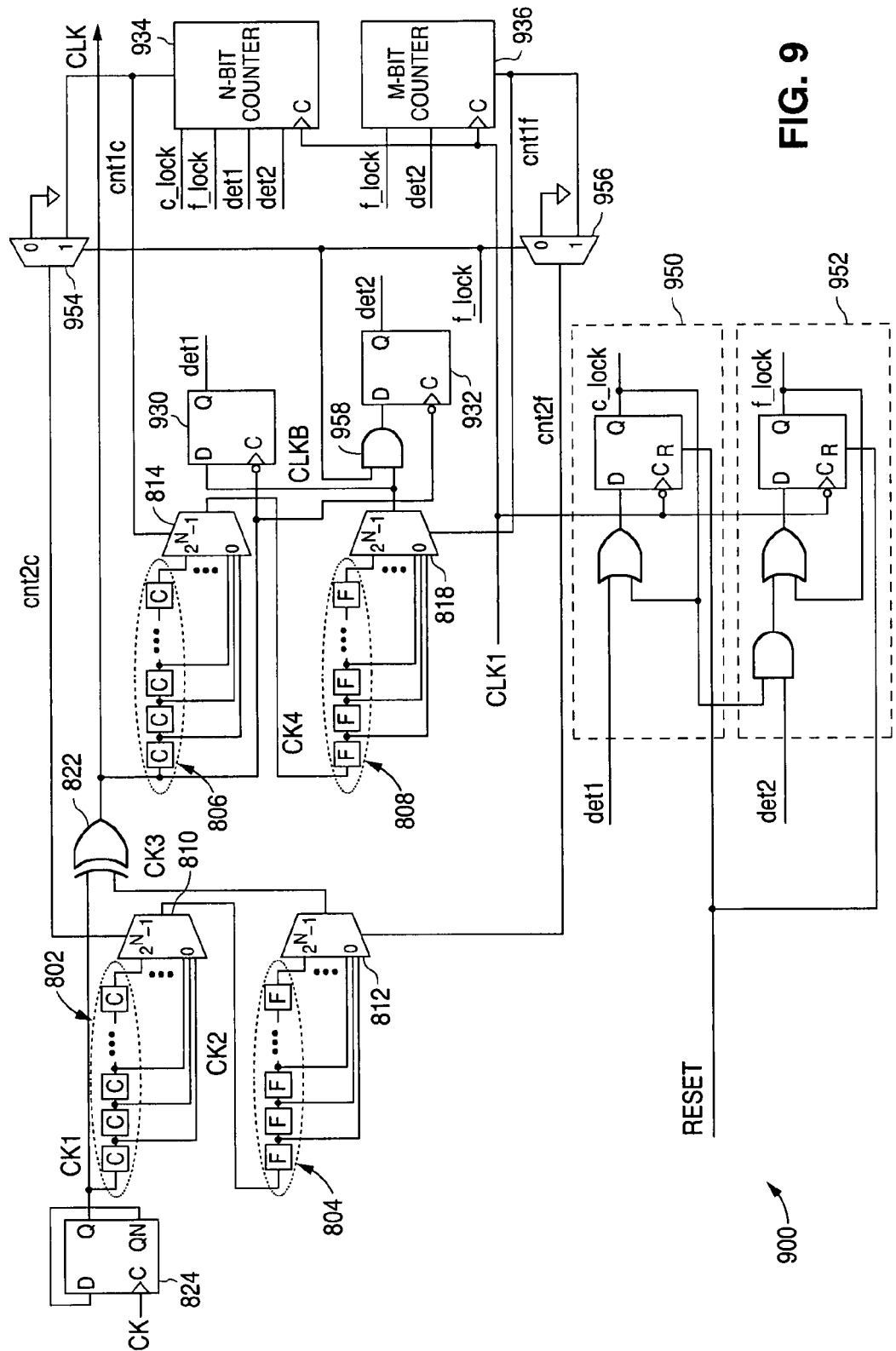
FIG. 9 illustrates an alternate embodiment of the third example duty cycle correction circuit according to one embodiment of this disclosure.

FIG. 9 illustrates an alternate embodiment of the third example duty cycle correction circuit according to one embodiment of this disclosure. In particular, FIG. 9 illustrates a duty cycle correction circuit 900 similar to the duty cycle correction circuit 800 of FIG. 8, where the duty cycle correction circuit 900 uses a locking mechanism similar in nature to the locking mechanism shown in FIG. 7.

As shown in FIG. 9, the duty cycle correction circuit 900 uses two registers 930-932 to generate two signals det1 and det2. The signals det1 and det2 are used by two counters 934-936 to generate the control signals cnt1c and cnt1f. As a particular example, the counter 934 could implement the following logic:

```
    if (~c_lock & det1) then cnt1c=cnt1c−1
    else if (~c_lock & ~det1) then cnt1c=cnt1c+1
    else if (~f_lock & det2) then cnt1c={1'b0, cnt1c}
    else cnt1c=cnt1c.
``` where c_lock and f_lock represent signals produced by two finite state machines 950-952. As another particular example, the counter 936 could implement the following logic:

```
    if (~f_lock & det2) then cnt1f={1'b0, cnt1f}
    else if (~f_lock & ~det2) cnt1f=cnt1f+1
    else cnt1f=cnt1f.
```

The duty cycle correction circuit 900 also includes the finite state machines 950-952 and two multiplexors 954-956, which act as control signal blockers to block the control signals cnt1c and cnt1f from reaching the multiplexors 810 and 812, respectively. In this example, the finite state machine 950 includes an OR gate and a register formed from a D flip-flop with reset. The finite state machine 950 uses the signal det1 to produce the signal c_lock. The finite state machine 952 includes an AND gate, an OR gate, and a register formed from a D flip-flop with reset. The finite state machine 952 uses the signal det2 and the output of the finite state machine 950 to produce the signal f_lock. The signals c_lock and f_lock are used by the counters 934-936 as shown above, by the multiplexors 954-956, and by an AND gate 958 to control the input to the register 932.

Initially, the multiplexor 810 may output the signal at its "0" input during coarse tuning, and the counter 934 varies the control signal cnt1c until the appropriate delay is identified using the multiplexor 816. At that point, the signal det1 goes high, causing the counter 934 to subtract its counter value by "1" (thereby reducing the identified sum delay of the delay lines 802 and 806) and causing the signal c_lock to become high. During fine tuning, the multiplexor 812 outputs the signal at its "0" input, and the counter 936 varies the control signal cnt1f until the appropriate delay is identified using the multiplexor 818. At that point, the signal det2 goes high, causing the counter 936 to divide its counter value in half (thereby dividing the identified delay between the delay lines 804 and 808 as well as dividing the identified delay between the delay lines 802 and 806) and causing the signal f_lock to become high. At the completion of fine tuning, the delay provided by the delay lines 802-804 is approximately equal to the delay provided by the delay lines 806-808.

Although FIGS. 1 through 9 have illustrated several duty cycle correction circuits, various changes may be made to FIGS. 1 through 9. For example, while shown as containing specific logic (such as XOR gates or D flip-flops), other logic that performs the same or similar functions could be used in the duty cycle correction circuits.

Figure 10:
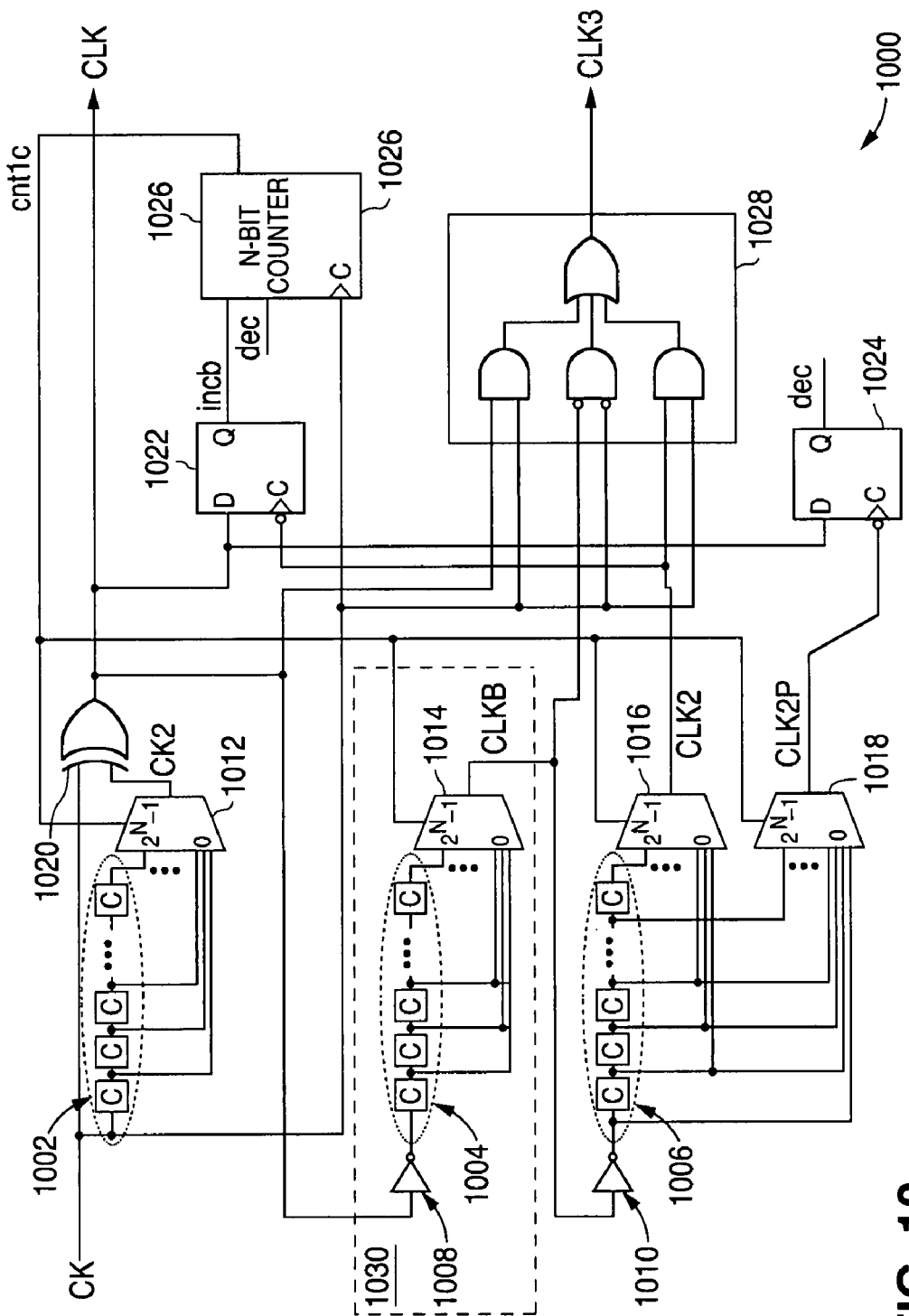
FIGS. 10 through 12 illustrate an example odd-number clock frequency multiplier according to one embodiment of this disclosure.
Figure 11:
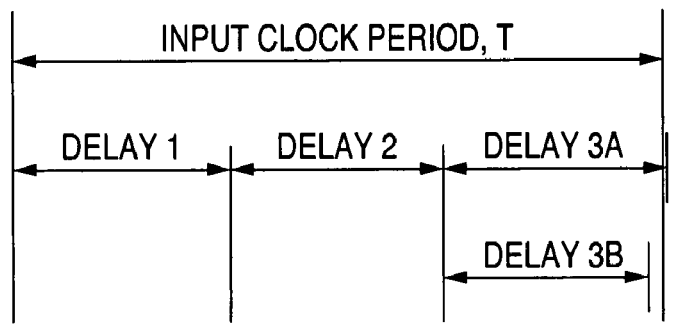
Figure 12:
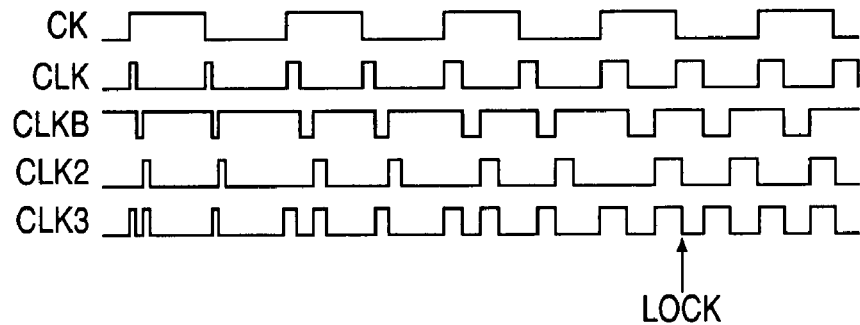

FIGS. 10 through 12 illustrate an example odd-number clock frequency multiplier according to one embodiment of this disclosure. In particular, FIG. 10 illustrates an odd-number clock frequency multiplier 1000, and FIGS. 11 and 12 illustrate example operations of the odd-number clock frequency multiplier 1000.

As shown in FIG. 10, the clock frequency multiplier 1000 is similar in structure to the duty cycle correction circuit 100. In this example, the clock frequency multiplier 1000 includes three delay lines 1002-1006, two inverters 1008-1010, four multiplexors 1012-1018, an XOR gate 1020, two registers 1022-1024, an N-bit up-down counter 1026, and a clock combiner 1028. In some embodiments, the delay lines 1002-1006 represent coarse delay lines. In particular embodiments, the delay lines 1002-1006 are identical to one another.

In this example, the delay line 1002 receives a clock signal CK and produces multiple delayed versions of the clock signal CK. The multiplexor 1012 selects and outputs one of the delayed versions of the clock signal CK as a clock signal CK2. The XOR gate 1020 uses the clock signals CK and CK2 to produce an output clock signal CLK.

The clock signal CLK is also inverted by the inverter 1008, and the delay line 1004 produces multiple delayed versions of the inverted clock signal CLK. The multiplexor 1014 selects and outputs one of the delayed versions of the inverted clock signal CLK as a clock signal CLKB. The inverter 1010 inverts the clock signal CLKB, and the delay line 1006 produces multiple delayed versions of the inverted clock signal CLKB. The multiplexor 1016 selects and outputs one of the delayed versions of the inverted clock signal CLKB as a clock signal CLK2. The multiplexor 1018 selects and outputs either the inverted clock signal CLKB or one of the delayed versions of the inverted clock signal CLKB as a clock signal CLK2P.

The clock signal CLK2 clocks the register 1022, which samples the clock signal CLK and outputs a signal incb. The clock signal CLK2P clocks the register 1024, which samples the clock signal CLK and outputs a signal dec. The signals incb and dec are used by the counter 1026 to adjust a counter value, which is output as a control signal cnt1c. The counter 1026 may, for example, operate in the same manner as the counter 120 of FIG. 1. The control signal cnt1c controls which signals are output by the multiplexors 1012-1018.

The combiner 1028 merges pulses in the clock signals CLK, CLKB, and CLK2 based on the input clock signal CK. In this example, the combiner 1028 includes three AND gates and one OR gate, where one of the AND gates has two inverted inputs. The combiner 1028 generates an output clock signal CLK3, which has three times the frequency of the input clock signal CK after locking.

Various components shown in FIG. 10 implement the same type of locking mechanism described above with respect to FIG. 1. The locking mechanism could, for example, include the registers 1022-1024 and the counter 1026, which generate the control signal cnt1c. The control signal cnt1c adjusts the operation of the multiplexors 1012-1018 until the appropriate output clock signal CLK3 is generated.

Example operations of the clock frequency multiplier 1000 are shown in FIGS. 11 and 12. In FIG. 11, "Delay 1" corresponds to the delay provided by the delay line 1002 at the tap point selected by the multiplexor 1012, and "Delay 2" corresponds to the delay provided by the delay line 1004 at the tap point selected by the multiplexor 1014. "Delay 3A" corresponds to the delay provided by the delay line 1006 at the tap point selected by the multiplexor 1016, and "Delay 3B" corresponds to the delay provided by the delay line 1006 at the tap point selected by the multiplexor 1018. Delay 1, Delay 2, and Delay 3A are approximately equal, and Delay 3B is shorter than Delay 1, Delay 2, and Delay 3A by an amount equal to the delay associated with one delay cell in the delay line 1006.

As shown in FIG. 11, the clock frequency multiplier 1000 generally operates to divide the period T of the input clock signal CK into thirds. The counter 1026 increments or decrements the counter value forming the control signal cnt1c until the end of the period T occurs within a range defined by (i) the combined value of Delay 1, Delay 2, and Delay 3A and (ii) the combined value of Delay 1, Delay 2, and Delay 3B. When this condition is satisfied, the tap points selected for the delay lines 1002-1006 are used to produce the output clock signal CLK3, which has approximately three times the frequency as the input clock signal CK.

As shown in FIG. 12, the input clock signal CK received by the clock frequency multiplier 1000 has a duty cycle of approximately fifty percent. The multiplexor 1012 provides a delayed version of the clock signal CK as the clock signal CK2 to the XOR gate 1020. The XOR gate 1020 produces the clock signal CLK. As shown in FIG. 12, the duty cycle of the clock signal CLK generally increases until the clock signal CLK has a pulse width that is approximately one third the pulse width of the input clock signal CK.

This pulse width is achieved by the counter 1026 adjusting which signals are output by the multiplexors 1012-1018. The inverter 1008, delay line 1004, and multiplexor 1014 use the clock signal CLK to generate the clock signal CLKB. As shown in FIG. 12, the clock signal CLKB represents an inverted version of the clock signal CLK that lags the clock signal CLK. The duty cycle of the clock signal CLKB generally increases until the clock signal CLKB has a pulse width that is approximately two thirds the pulse width of the input clock signal CK.

The inverter 1010, delay line 1006, and multiplexors 1016-1018 use the clock signal CLKB to generate the clock signals CLK2 and CLK2P. As shown in FIG. 12, the clock signal CLK2 represents a delayed version of the clock signal CLK. The clock signal CLK2P would therefore represent a similar signal that leads the clock signal CLK2 by one delay cell delay.

The clock signals CLK2 and CLK2P are used to produce the signals incb and dec, which are used by the counter 1026 to increment or decrement a counter value. Through operation of the counter 1026, the pulses in the clock signals CLK, CLKB, and CLK2 are eventually used to divide each period of the clock signal CK into thirds. By combining the pulses, the combiner 1028 effectively triples the frequency of the clock signal CK in the clock signal CLK3, and the clock signal CLK3 achieves a duty cycle of approximately fifty percent. In some embodiments, the multiplexors 1012-1018 initially output the signals received at their "0" inputs, and the multiplexors 1012-1018 output different signals as the value provided by the counter 1026 changes.

While the clock frequency multiplier 1000 shown in FIG. 10 is used to multiply the frequency of the input clock signal CK by three, the clock frequency multiplier 1000 of FIG. 10 could be extended to multiply the frequency of the clock signal CK by any higher odd number. For example, to multiply the frequency of the clock signal CK by five, the elements shown in box 1030 of FIG. 10 could be duplicated two additional times, providing (among other things) three delay lines 1004 and five delay lines in total. Also, the combiner 1028 could be extended to include five AND gates and one OR gate. Similarly, to multiply the frequency of the clock signal CK by seven, the elements shown in box 1030 of FIG. 10 could be duplicated four additional times, providing five delay lines 1004 and seven delay lines total. Also, the combiner 1028 could be extended to include seven AND gates and one OR gate.

Figure 13:
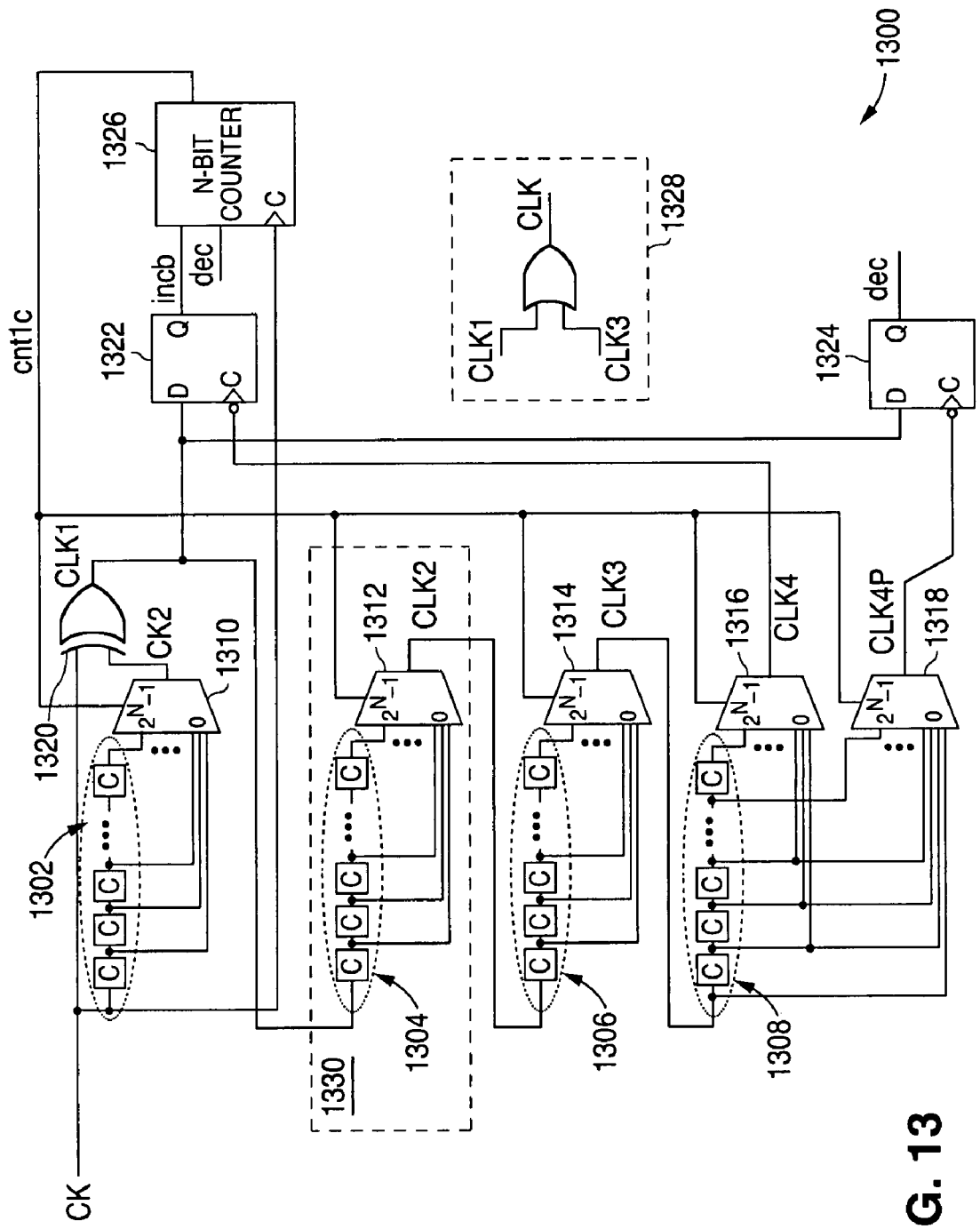
FIG. 13 illustrates an example even-number clock frequency multiplier according to one embodiment of this disclosure.

FIG. 13 illustrates an example even-number clock frequency multiplier 1300 according to one embodiment of this disclosure. In this example embodiment, the clock frequency multiplier 1300 includes four delay lines 1302-1308, five multiplexors 1310-1318, an XOR gate 1320, two registers 1322-1324, an N-bit up-down counter 1326, and a clock combiner 1328. In particular embodiments, the delay lines 1302-1308 are identical to one another.

The delay line 1302 produces multiple delayed versions of an input clock signal CK, and one version is output by the multiplexor 1310 as a clock signal CK2. The XOR gate 1320 generates a clock signal CLK1 using the clock signals CK and CK2. The delay line 1304 and multiplexor 1312 generate a clock signal CLK2 using the clock signal CLK1. The delay line 1306 and the multiplexor 1314 generate a clock signal CLK3 using the clock signal CK2. The delay line 1308 and the multiplexors 1316-1318 generate clock signals CLK4 and CLK4P using the clock signal CLK3.

The clock signals CLK4 and CLK4P clock the registers 1322-1324, respectively, which generate signals incb and dec. The signals incb and dec are used by the counter 1326 to increment or decrement a counter value and generate a control signal cnt1c, which controls the multiplexors 1310-1318. The counter 1326 may, for example, operate in the same manner as the counter 120 of FIG. 1. In some embodiments, the multiplexors 1310-1318 output the signals received at their "0" inputs, and the multiplexors 1310-1318 output different signals as the value provided by the counter 1326 changes.

The combiner 1328 merges pulses in two of the clock signals CLK1-CLK4 to generate an output clock signal CLK. Each of the clock signals CLK1-CLK4 has a pulse width that is approximately one-fourth the pulse width of the input clock signal CK. Also, each of the clock signals CLK1-CLK4 has two pulses during each cycle of the clock signal CK. By combining either the clock signals CLK1 and CLK3 or the clock signals CLK2 and CLK4, the output clock signal CLK has four times the frequency of the input clock signal CK. In this example, the combiner 1328 includes one OR gate that combines the clock signals CLK1 and CLK3. In other embodiments, the combiner 1328 could combine the clock signals CLK2 and CLK4.

Various components shown in FIG. 13 implement the same type of locking mechanism described above with respect to FIG. 1. Among other things, these components generate the signals incb and dec, which are used by the counter 1326 to increment or decrement the control signal cnt1c and generate the appropriate output clock signal CLK.

While the clock frequency multiplier 1300 shown in FIG. 13 is used to multiply the frequency of an input clock signal CK by four, the clock frequency multiplier 1300 of FIG. 13 could be extended to multiply the frequency of the clock signal CK by any higher even number. For example, to multiply the frequency of the clock signal CK by six, the elements shown in box 1330 of FIG. 13 could be duplicated two additional times, providing (among other things) three delay lines 1304 and six delay lines in total. Similarly, to multiply the frequency of the clock signal CK by eight, the elements shown in box 1330 of FIG. 13 could be duplicated four additional times, providing five delay lines 1304 and eight delay lines total. In either case, the combiner 1328 could include a single OR gate or multiple OR gates to combine the signals produced by at least some of the delay lines.

Although FIGS. 10 through 13 have illustrated several clock frequency multipliers, various changes may be made to FIGS. 10 through 13. For example, while shown as containing specific logic (such as XOR gates or D flip-flops), other logic that performs the same or similar functions could be used in the duty cycle correction circuits. Also, as noted above, the clock frequency multipliers could be expanded to multiply a clock frequency by different amounts.

Figure 14:
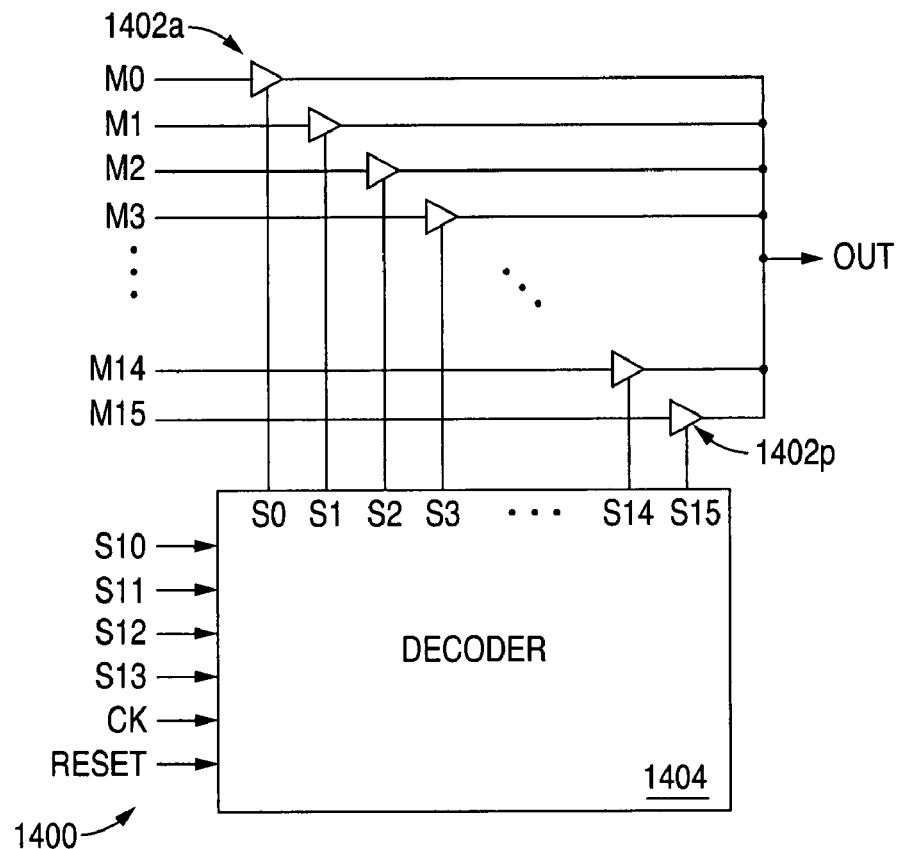
FIGS. 14 and 15 illustrate an example multiplexor according to one embodiment of this disclosure.
Figure 15:
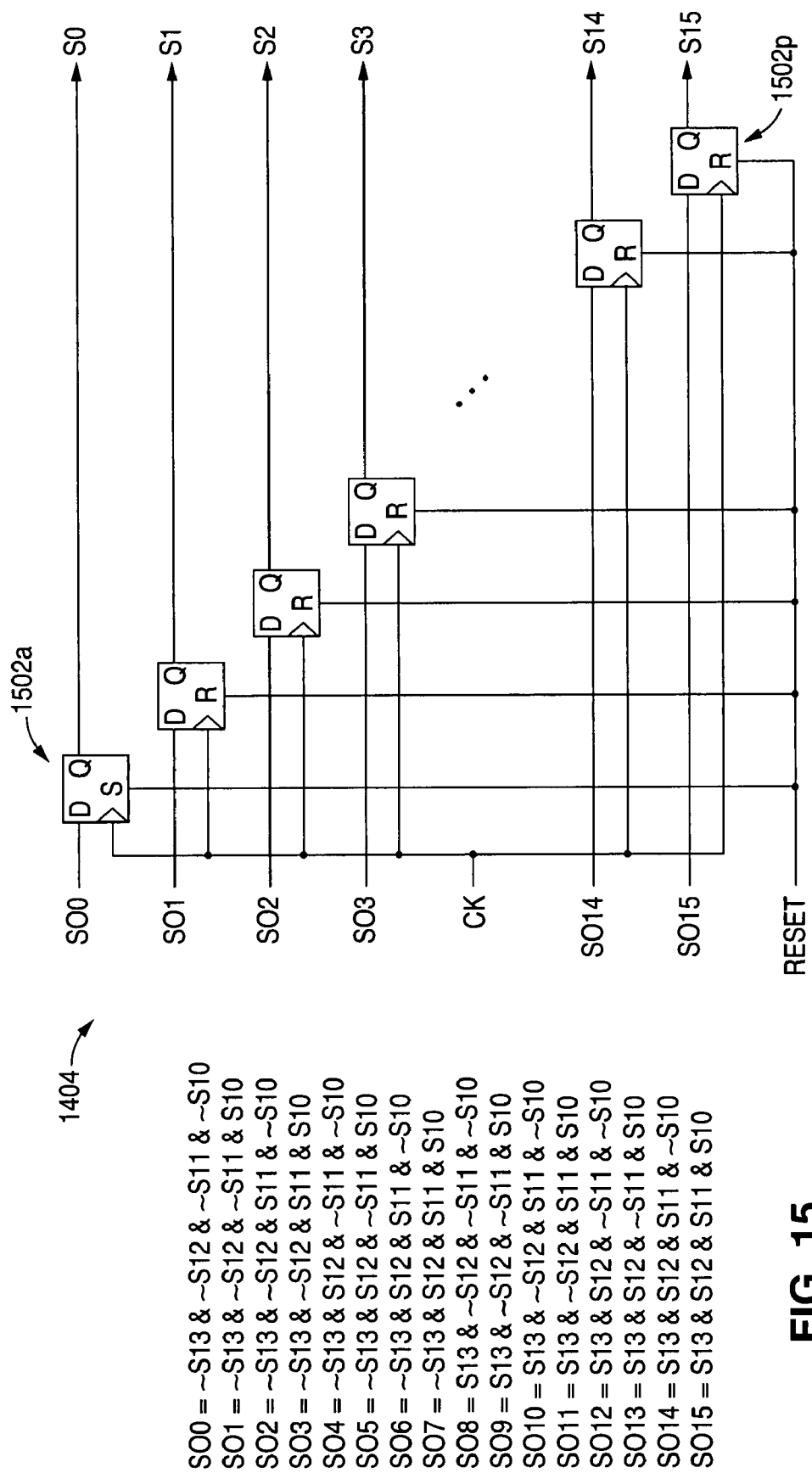

FIGS. 14 and 15 illustrate an example multiplexor according to one embodiment of this disclosure. In particular, FIG. 14 illustrates an example multiplexor 1400, and FIG. 15 illustrates an example decoder used in the multiplexor 1400. The multiplexor 1400 shown in FIGS. 14 and 15 could be used as any of the multiplexors in any of the preceding figures.

As shown in FIG. 14, the multiplexor 1400 receives sixteen input signals M0-M15 and produces an output signal OUT. The output signal OUT generally represents a selected one of the input signals M0-M15. The multiplexor 1400 may generally operate to block all but one of the input signals M0-M15 from the output signal OUT.

In this example, the multiplexor 1400 includes multiple tri-state buffers 1402a-1402p and a decoder 1404. Based on control signals S0-S15 from the decoder 1404, each of the tri-state buffers 1402a-1402p either allows one of the input signals M0-M15 to pass or enters a high impedance state. During operation, the decoder 1404 typically allows different tri-state buffers 1402a-1402p to output their associated input signals in the output signal OUT, thereby controlling which input signals are blocked and which input signal is allowed to pass.

In this example, the decoder 1404 receives four input control signals SI0-SI3, a clock signal CK, and a reset signal RESET. The decoder 1404 generates the control signals S0-S15 using the input control signals SI0-SI3, and logic in the decoder 1404 is clocked by the clock signal CK. As shown in FIG. 15, one embodiment of the decoder 1404 uses combinatorial logic or other circuitry to generate intermediate signals SO0-SO15. The intermediate signals SO0-SO15 are provided to registers 1502a-1502p, respectively. In this example, the register 1502a represents a D flip-flop with set and the registers 1502b-1502p represent D flip-flops with reset. The registers 1502a-1502p sample the intermediate signals SO0-SO15 to produce the output signals S0-S15.

Although FIGS. 14 and 15 illustrate one example of a multiplexor 1400, various changes may be made to FIGS. 14 and 15. For example, the multiplexor 1400 could be modified to handle any number of input signals in place of signals M0-M15 (such as $2^N$ input signals) and any number of input control signals in place of SI0-SI3 (such as N control signals). Also, the circuits shown in FIGS. 1 through 13 could use any other suitable multiplexor or multiplexors and need not use the specific multiplexor 1400 shown in FIGS. 14 and 15.

Figure 17:
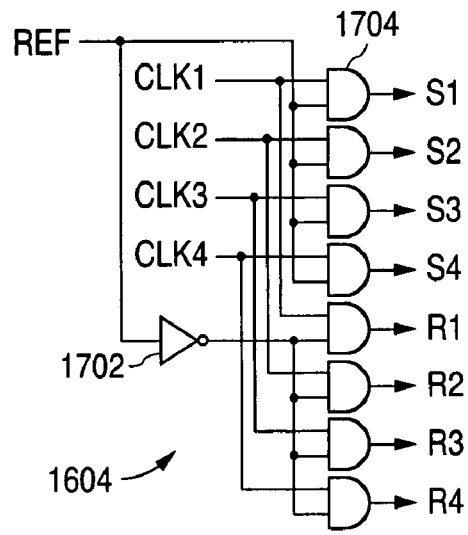
Figure 16:
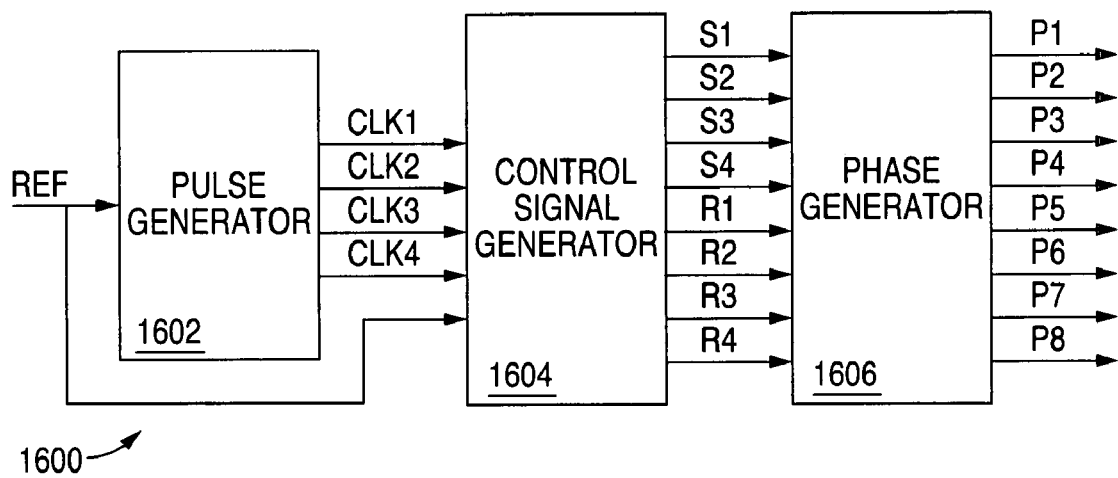

FIGS. 16 through 18B illustrate an example digital multiphase oscillator according to one embodiment of this disclosure. In particular, FIG. 16 illustrates an example digital multiphase oscillator 1600, FIG. 17 illustrates an example control signal generator in the digital multiphase oscillator 1600, and FIGS. 18A and 18B illustrate example phase generators in the digital multiphase oscillator 1600.

As shown in FIG. 16, the digital multiphase oscillator 1600 includes a pulse generator 1602, a control signal generator 1604, and a phase generator 1606. The pulse generator 1602 receives a reference clock signal REF and generates four clock signals CLK1-CLK4. In this example, each of the clock signals CLK1-CLK4 contains two pulses for every pulse in the reference clock signal REF. Once locked, the clock signals CLK1-CLK4 also have a pulse width equal to one-fourth the pulse width of the reference clock signal REF. Collectively, the clock signals CLK1-CLK4 contain eight pulses for each pulse in the reference clock signal REF. The pulse generator 1602 could, for example, represent the clock frequency multiplier 1300 of FIG. 13 (without the clock combiner 1328).

The control signal generator 1604 uses the clock signals CLK1-CLK4 and the reference clock signal REF to generate control signals S1-S4 and R1-R4. As shown in FIG. 17, the control signal generator 1604 could include an inverter 1702 and multiple AND gates 1704. The inverter 1702 inverts the reference clock signal REF. Each AND gate 1704 performs a logical AND operation using one of the clock signals CLK1-CLK4 and either the reference clock signal REF or the inverted reference clock signal REF. The control signals S1-S4 and R1-R4 are used to control the operation of the phase generator 1606.

The phase generator 1606 receives the control signals S1-S4 and R1-R4 from the control signal generator 1604. As shown in FIG. 18A, the phase generator 1606 may be formed from multiple registers 1802a-1802h. In this example, each of the registers 1802a-1802h represents a D flip-flop with set and reset, where the clock input and D input for each register is grounded. Each of the registers 1802a-1802h receives a different one of the control signals S1-S4 and R1-R4 as its set (S) input, and each of the registers 1802a-1802h receives a different one of the control signals S1-S4 and R1-R4 as its reset (R) input. Each of the registers 1802a-1802h outputs a high logic value when its set input is high and a low logic value when its reset input is high.

Because the control signals S1-S4 and R1-R4 are based on accurate clock signals CLK1-CLK4 produced by the pulse generator 1602, the registers 1802a-1802h produce output signals P1-P8 that represent equally-spaced out-of-phase signals. For example, the output signals P1-P8 may represent different out-of-phase versions of the reference clock signal REF. As a particular example, the output signal P1 may be approximately in-phase with the reference clock signal REF, and each of the remaining output signals P2-P8 may be approximately 45° out-of-phase with respect to the previous output signal. In this example, the output signal P2 may be 45° out-of-phase with respect to the reference clock signal REF, the output signal P3 may be 90° out-of-phase with respect to the reference clock signal REF, the output signal P5 may be 180° out-of-phase with respect to the reference clock signal REF, and the output signal P7 may be 270° out-of-phase with respect to the reference clock signal REF.

As shown in FIG. 18B, the phase generator 1606 may also be formed from multiple latches 1852a-1852h. For example, each of the latches 1852a-1852h could represent an S-R latch formed from two two-input NOR gates as shown in FIG. 18B. Each of the latches 1852a-1852h receives a different one of the control signals S1-S4 and R1-R4 as its set (S) input, and each of the latches 1852a-1852h receives a different one of the control signals S1-S4 and R1-R4 as its reset (R) input. Because the control signals S1-S4 and R1-R4 are based on accurate clock signals CLK1-CLK4 produced by the pulse generator 1602, the latches 1852a-1852h produce output signals P1-P8 that represent equally-spaced out-of-phase signals.

The digital multiphase oscillator 1600 of FIG. 16 could be used in a wide variety of applications. For example, the digital multiphase oscillator 1600 could be used in phase locked loops (PLLs), clock/data recovery (CDR) circuits, and clock generators. As a particular example, in clock/data recovery circuits, the digital multiphase oscillator 1600 could be used to recover data or clock signals while reducing or eliminating PVT variations, which typically cause jitter or other problems in conventional clock/data recovery circuits.

Although FIGS. 16 through 18B illustrate one example of a digital multiphase oscillator 1600, various changes may be made to FIGS. 16 through 18. For example, the pulse generator 1602 could represent any suitable circuit that uses digital delay to accurately provide multiple clock signals.

Also, the embodiments of the control signal generator 1604 and phase generator 1606 shown in FIGS. 17, 18A, and 18B are for illustration only. Other embodiments of the control signal generator 1604 and phase generator 1606 could be used. In addition, the pulse generator 1602, control signal generator 1604, and phase generator 1606 could each produce any suitable number of outputs.

Figure 19:
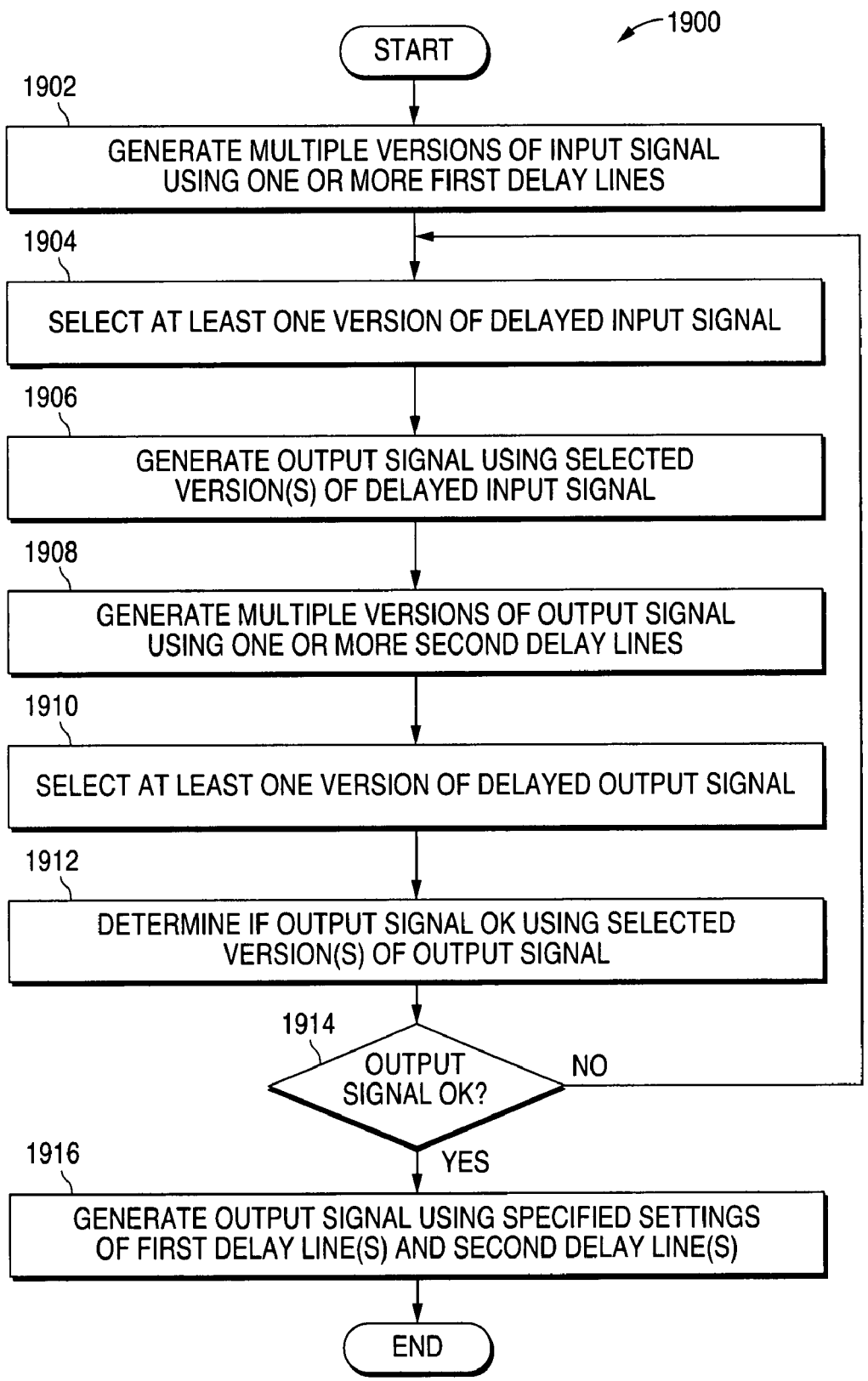
FIG. 19 illustrates an example method for digital delay according to one embodiment of this disclosure.

FIG. 19 illustrates an example method 1900 for digital delay according to one embodiment of this disclosure. For ease of explanation, the method 1900 is described with respect to the various circuits shown in the preceding figures. The same or similar method could be used with any other suitable circuit.

Multiple versions of an input signal are generated using one or more first delay lines at step 1902. This may include, for example, the delay line 102, the delay lines 402-404, the delay line 802-804, the delay line 1002, or the delay line 1302 generating multiple delayed versions of an input clock signal CK. The multiple versions of the input signal are generated at multiple tap points in at least one of the first delay lines.

At least one of the delayed versions of the input signal is selected at step 1904. This may include, for example, the multiplexor 106, the multiplexor 410, the multiplexors 810-812, the multiplexor 1012, or the multiplexor 1310 selecting and outputting at least one of the delayed versions of the input clock signal CK. Initially, each multiplexor may output the signal received at its "0" input.

An output signal is generated using the selected delayed version(s) of the input signal at step 1906. This may include, for example, the XOR gate 112, the XOR gate 416, the XOR gate 822, the XOR gate 1020, or the XOR gate 1320 generating an output clock signal (such as signal CLK or signal CLK1). The XOR gate could generate the output signal using the input signal and a delayed version of the input signal.

Multiple versions of the output signal are generated using one or more second delay lines at step 1908. This may include, for example, the delay line 104, the delay lines 406-408, the delay lines 806-808, the delay lines 1004-1006, or the delay lines 1304-1308 generating multiple delayed versions of the output clock signal CLK or CLK1. The multiple versions of the output signal are generated at multiple tap points in at least one of the second delay lines.

At least one of the delayed versions of the output signal is selected at step 1910. This may include, for example, the multiplexors 108-110, the multiplexor 412 or the multiplexors 412-414, the multiplexors 814-820 or the multiplexors 814 and 818, the multiplexors 1014-1018, or the multiplexors 1312-1318 selecting and outputting at least one of the delayed versions of the output clock signal. Initially, each multiplexor may output the signal received at its "0" input.

A determination is made as to whether the output signal is acceptable using the selected version(s) of the output signal at step 1912. This may include, for example, using multiple selected versions of the output signal to determine if the output signal has a duty cycle of approximately fifty percent. This may also include using multiple selected versions of the output signal to determine if the output signal is a frequency multiple of the input signal. This may further include using a single selected version of the output signal to determine if the output signal has a duty cycle of approximately fifty percent and/or is a frequency multiple of the input signal.

If the output signal is not acceptable at step 1914, the method 1900 returns to step 1904 to repeat steps 1904-1912 using different selected versions of the delayed input and output signals. This may include, for example, incrementing or decrementing one of one or more counter values to alter the outputs of the multiplexors 106-110, the multiplexors 410-414, the multiplexors 810-820, the multiplexors 1012-1018, or the multiplexor 1310-1318.

If the output signal is acceptable at step 1914, the output signal is generated using specified settings of the one or more first delay lines and the one or more second delay lines at step 1916. This may include, for example, using one or more current counter values to control the outputs of the multiplexors. This may also include altering one or more current counter values (such as dividing a counter value in half) to control the outputs of the multiplexors.

Although FIG. 19 illustrates one example of a method 1900 for digital delay, various changes may be made to FIG. 19. For example, various steps in FIG. 19 could be repeated to identify the appropriate settings for multiple delay lines. This may occur when various steps in FIG. 19 are used during coarse tuning and then repeated during fine tuning.

It may be advantageous to set forth definitions of certain words and phrases that have been used within this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method, comprising:
generating multiple delayed versions of a first signal using at least one first delay line;
selecting at least one version of the first signal;
generating a second signal based on the at least one selected version of the first signal;
generating multiple delayed versions of the second signal using at least one second delay line;
selecting at least one version of the second signal; and
modifying selection of the at least one version of the first signal and the at least one version of the second signal to achieve a desired output signal.

2. The method of claim 1, wherein:
the at least one first delay line comprises a first coarse delay line;
the at least one second delay line comprises a second coarse delay line;
selecting the at least one version of the first signal comprises using a first multiplexor capable of receiving the delayed versions of the first signal from the first coarse delay line; and
selecting the at least one version of the second signal comprises using (i) a second multiplexor capable of receiving the delayed versions of the second signal from the second coarse delay line and (ii) a third multiplexor capable of receiving some of the delayed versions of the second signal from the second coarse delay line and the second signal.

3. The method of claim 1, wherein:
the at least one first delay line comprises (i) a first offset delay line and (ii) a first fine delay line;
the at least one second delay line comprises (i) a second offset delay line and (ii) a second fine delay line;
selecting the at least one version of the first signal comprises using a first multiplexor capable of receiving the delayed versions of the first signal from the first fine delay line; and
selecting the at least one version of the second signal comprises using a second multiplexor capable of receiving the delayed versions of the second signal from the second fine delay line.

4. The method of claim 3, wherein selecting the at least one version of the second signal further comprises using a third multiplexor capable of receiving some of the delayed versions of the second signal from the second fine delay line and an output of the second offset delay line.

5. The method of claim 1, wherein:
the at least one first delay line comprises (i) a first coarse delay line and (ii) a first fine delay line;
the at least one second delay line comprises (i) a second coarse delay line and (ii) a second fine delay line;
selecting the at least one version of the first signal comprises using (i) a first multiplexor coupled to the first coarse delay line, an output of the first multiplexor coupled to the first fine delay line, and (ii) a second multiplexor coupled to the first fine delay line and capable of providing one version of the first signal; and
selecting the at least one version of the second signal comprises using (i) a third multiplexor coupled to the second coarse delay line, an output of the third multiplexor coupled to the second fine delay line, and (ii) a fourth multiplexor coupled to the second fine delay line and capable of providing one version of the second signal.

6. The method of claim 5, wherein:
selecting the at least one version of the second signal further comprises using (iii) a fifth multiplexor capable of receiving some of the delayed versions of the second signal from the second coarse delay line and the second signal, and (iv) a sixth multiplexor capable of receiving some of the delayed versions of the second signal from the second fine delay line and the output of the third multiplexor.

7. The method of claim 1, wherein:
the at least one first delay line comprises a first coarse delay line;
the at least one second delay line comprises a plurality of second coarse delay lines;
selecting the at least one version of the first signal comprises using a first multiplexor coupled to the first coarse delay line; and
selecting the at least one version of the second signal comprises using (i) a plurality of second multiplexors, each second coarse delay line associated with one of the second multiplexors, and (ii) a third multiplexor coupled to a last of the second coarse delay lines.

8. The method of claim 7, further comprising inverting an input to each of the second coarse delay lines.

9. The method of claim 1, wherein:

modifying the selection of the versions of the first and second signals comprises modifying one or more outputs of one or more counters; and selecting the at least one version of the first signal and selecting the at least one version of the second signal comprise selecting the versions of the first and second signals based on the one or more outputs of the one or more counters.

10. The method of claim 9, wherein:

the one or more counters comprise a plurality of counters; and further comprising preventing one of the counters from altering its output while another of the counters is altering its output.

11. A circuit, comprising:

at least one first delay line capable of generating multiple delayed versions of a first signal;

first selection circuitry capable of selecting at least one version of the first signal;

circuitry capable of generating a second signal based on the at least one selected version of the first signal;

at least one second delay line capable of generating multiple delayed versions of the second signal;

second selection circuitry capable of selecting at least one version of the second signal; and control circuitry capable of controlling the first selection circuitry and the second selection circuitry to achieve a desired output signal.

12. The circuit of claim 11, wherein:

the at least one first delay line comprises a first coarse delay line;

the at least one second delay line comprises a second coarse delay line;

the first selection circuitry comprises a first multiplexor capable of receiving the delayed versions of the first signal from the first coarse delay line; and the second selection circuitry comprises (i) a second multiplexor capable of receiving the delayed versions of the second signal from the second coarse delay line and (ii) a third multiplexor capable of receiving some of the delayed versions of the second signal from the second coarse delay line and the second signal.

13. The circuit of claim 11, wherein:

the at least one first delay line comprises (i) a first offset delay line and (ii) a first fine delay line;

the at least one second delay line comprises (i) a second offset delay line and (ii) a second fine delay line;

the first selection circuitry comprises a first multiplexor capable of receiving the delayed versions of the first signal from the first fine delay line; and the second selection circuitry comprises a second multiplexor capable of receiving the delayed versions of the second signal from the second fine delay line.

14. The circuit of claim 13, wherein the second selection circuitry further comprises a third multiplexor capable of receiving some of the delayed versions of the second signal from the second fine delay line and an output of the second offset delay line.

15. The circuit of claim 11, wherein:

the at least one first delay line comprises (i) a first coarse delay line and (ii) a first fine delay line;

the at least one second delay line comprises (i) a second coarse delay line and (ii) a second fine delay line;

the first selection circuitry comprises (i) a first multiplexor coupled to the first coarse delay line, an output of the first multiplexor coupled to the first fine delay line, and (ii) a second multiplexor coupled to the first fine delay line and capable of providing one version of the first signal; and the second selection circuitry comprises (i) a third multiplexor coupled to the second coarse delay line, an output of the third multiplexor coupled to the second fine delay line, and (ii) a fourth multiplexor coupled to the second fine delay line and capable of providing one version of the second signal.

16. The circuit of claim 15, wherein:

the second selection circuitry further comprises (iii) a fifth multiplexor capable of receiving some of the delayed versions of the second signal from the second coarse delay line and the second signal, and (iv) a sixth multiplexor capable of receiving some of the delayed versions of the second signal from the second fine delay line and the output of the third multiplexor.

17. The circuit of claim 11, wherein:

the at least one first delay line comprises a first coarse delay line;

the at least one second delay line comprises a plurality of second coarse delay lines;

the first selection circuitry comprises a first multiplexor coupled to the first coarse delay line; and the second selection circuitry comprises (i) a plurality of second multiplexors, each second coarse delay line associated with one of the second multiplexors, and (ii) a third multiplexor coupled to a last of the second coarse delay lines.

18. The circuit of claim 11, wherein:

the first selection circuitry and the second selection circuitry comprise a plurality of multiplexors; and the control circuitry comprises one or more counters, wherein one or more outputs from the one or more counters are capable of controlling the plurality of multiplexors.

19. The circuit of claim 18, wherein:

the one or more counters comprise a plurality of counters; and further comprising at least one finite state machine capable of preventing one of the counters from altering its output while another of the counters is altering its output.

20. A digital multiphase oscillator, comprising:

a phase generator capable of generating a plurality of out-of-phase signals;

a control signal generator capable of generating a plurality of control signals for the phase generator; and a pulse generator capable of generating a plurality of clock signals for the control signal generator, the pulse generator comprising:

at least one first delay line capable of generating multiple delayed versions of a first signal;

first selection circuitry capable of selecting at least one version of the first signal;

circuitry capable of generating a second signal based on the at least one selected version of the first signal;

at least one second delay line capable of generating multiple delayed versions of the second signal;

second selection circuitry capable of selecting at least one version of the second signal; and control circuitry capable of controlling the first selection circuitry and the second selection circuitry;

wherein the second signal and one or more of the at least one selected version of the second signal comprise the clock signals.

21. The digital multiphase oscillator of claim 20, wherein:

the at least one first delay line comprises a first coarse delay line;

the at least one second delay line comprises a plurality of second coarse delay lines;

the first selection circuitry comprises a first multiplexor coupled to the first coarse delay line; and the second selection circuitry comprises (i) a plurality of second multiplexors, each second coarse delay line associated with one of the second multiplexors, and (ii) a third multiplexor coupled to a last of the second coarse delay lines;

wherein the second signal and outputs of the second multiplexors comprise the clock signals.

\* \* \* \* \*